(12) United States Patent
Sasaki

(10) Patent No.: US 7,968,269 B2
(45) Date of Patent: Jun. 28, 2011

(54) POSITIVE RESIST COMPOSITION FOR IMMERSION EXPOSURE AND METHOD OF FORMING RESIST PATTERN

(75) Inventor: Kazuhito Sasaki, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 386 days.

(21) Appl. No.: 12/160,957

(22) PCT Filed: Dec. 8, 2006

(86) PCT No.: PCT/JP2006/324550
§ 371 (c)(1),
(2), (4) Date: Jul. 15, 2008

(87) PCT Pub. No.: WO2007/083458
PCT Pub. Date: Jul. 26, 2007

(65) Prior Publication Data
US 2010/0196823 A1 Aug. 5, 2010

(30) Foreign Application Priority Data

Jan. 17, 2006 (JP) .................. 2006-008538

(51) Int. Cl.
G03F 7/004 (2006.01)
G03F 7/30 (2006.01)
(52) U.S. Cl. .................. 430/270.1; 430/326; 430/905; 430/910
(58) Field of Classification Search .............. 430/270.1, 430/326, 905, 910
See application file for complete search history.

(56) References Cited

U.S. PATENT DOCUMENTS

| 5,945,517 | A | 8/1999 | Nitta et al. | |
|---|---|---|---|---|
| 6,180,313 | B1 | 1/2001 | Yukawa et al. | |
| 6,280,898 | B1 | 8/2001 | Hasegawa et al. | |
| 6,329,125 | B2 | 12/2001 | Takechi et al. | |
| 6,720,128 | B2 * | 4/2004 | Adegawa et al. | 430/270.1 |
| 2001/0014427 | A1 * | 8/2001 | Suwa et al. | 430/270.1 |
| 2005/0019690 | A1 | 1/2005 | Kodama | |
| 2005/0186503 | A1 | 8/2005 | Nishiyama et al. | |
| 2005/0227173 | A1 | 10/2005 | Hatakeyama et al. | |
| 2006/0234164 | A1 | 10/2006 | Rhodes et al. | |
| 2008/0063975 | A1 | 3/2008 | Takeshita et al. | |

FOREIGN PATENT DOCUMENTS

| EP | 1 717 261 | 11/2006 |
|---|---|---|
| JP | H09-208554 | 8/1997 |
| JP | H10-161313 | 6/1998 |
| JP | H11-035551 | 2/1999 |
| JP | H11-035552 | 2/1999 |
| JP | H11-035573 | 2/1999 |
| JP | H11-322707 | 11/1999 |
| JP | 2000-159758 | 6/2000 |
| JP | 2000-235263 | 8/2000 |
| JP | 2001-318465 | 11/2001 |
| JP | 2005-55890 | 3/2005 |
| JP | 2005-220059 | 8/2005 |
| JP | 2005-234330 | 9/2005 |
| JP | 2005-320516 | 11/2005 |
| JP | 2006-243264 | 9/2006 |
| JP | 2006-291177 | 10/2006 |
| JP | 2006-301435 | 11/2006 |
| WO | WO 2004/074242 | 9/2004 |
| WO | WO 2005/075446 | 8/2005 |
| WO | WO 2005/080473 | 9/2005 |
| WO | WO 2005/121193 | 12/2005 |
| WO | WO 2005/123795 | 12/2005 |

OTHER PUBLICATIONS

Hoffnagle et al., "Liquid immersion deep-ultraviolet interferometric lithography", Journal of Vacuum Science & Technology B, vol. 17, No. 6, pp. 3306-3309, (1999).
Switkes et al., "Immersion lithography at 157 nm", Journal of Vacuum Science & Technology B, vol. 19, No. 6, pp. 2353-2356, (2001).
Switkes et al., "Resolution Enhancement of 157 nm Lithography by Liquid Immersion", Proceedings of SPIE, vol. 4691, pp. 459-465, (2002).
International Search Report in connection with corresponding PCT Application No. PCT/JP2006/324550, dated Jan. 9, 2007.

* cited by examiner

Primary Examiner — John S Chu
(74) Attorney, Agent, or Firm — Knobbe, Martens, Olson & Bear, LLP

(57) ABSTRACT

A positive resist composition for immersion exposure including a resin component (A) which has acid dissociable, dissolution inhibiting groups and exhibits increased alkali solubility under action of acid and an acid-generator component (B) which generates acid upon exposure, the resin component (A) including a cyclic principal chain polymer (A1) and a non-cyclic principal chain polymer (A2) having a structural unit (a) derived from acrylic acid as a principal chain, and the non-cyclic principal chain polymer (A2) having a structural unit (a1) derived from an acrylate ester having an acid dissociable, dissolution inhibiting group (p1) represented by general formula (p1) shown below:

[Chemical Formula 1]

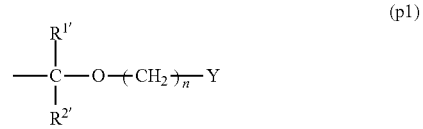

(p1)

wherein $R^{1\prime}$ and $R^{2\prime}$ each independently represents a hydrogen atom or an alkyl group of 1 to 5 carbon atoms; n represents an integer of 0 to 3; and Y represents an alkyl group of 1 to 5 carbon atoms or an aliphatic cyclic group of 5 to 16 carbon atoms.

13 Claims, 1 Drawing Sheet

POSITIVE RESIST COMPOSITION FOR IMMERSION EXPOSURE AND METHOD OF FORMING RESIST PATTERN

RELATED APPLICATIONS

This application is the U.S. National Phase filing under 35 U.S.C. §371 of PCT/JP2006/324550, filed Dec. 8, 2006, which designated the United States and was published in a language other than English, which claims priority under 35 U.S.C. §119(a)-(d) to Japanese Patent Application No. 2006-008538, filed Jan. 17, 2006. The contents of these applications are incorporated herein by reference in their entireties.

TECHNICAL FIELD

The present invention relates to a resist composition for use in immersion exposure (immersion lithography), and a method of forming a resist pattern.

BACKGROUND ART

Lithography methods are widely used in the production of microscopic structures in a variety of electronic devices such as semiconductor devices and liquid crystal devices, and ongoing miniaturization of the structures of these devices has lead to demands for further miniaturization of the resist patterns used in these lithography processes. With current lithography methods, using the most up-to-date ArF excimer lasers, fine resist patterns with a line width of approximately 90 nm are able to be formed, but in the future, even finer pattern formation will be required.

In order to enable the formation of these types of ultra fine patterns of less than 90 nm, the development of appropriate exposure apparatus and corresponding resists is the first requirement.

With respect to resists, chemically amplified resists, which enable high levels of resolution to be achieved, are able to utilize a catalytic reaction or chain reaction of an acid generated by irradiation, exhibit a quantum yield of 1 or greater, and are capable of achieving high sensitivity, are attracting considerable attention, and development of these resists is flourishing.

Until recently, polyhydroxystyrene (PHS) or PHS-based resins in which the hydroxyl groups have been protected with acid dissociable, dissolution inhibiting groups, which exhibit a high degree of transparency relative to a KrF excimer laser (248 nm), and resins that contain structural units derived from (meth)acrylate esters within the principal chain (acrylic resins) in which the carboxy group is protected with an acid dissociable, dissolution inhibiting group, which exhibit a high degree of transparency relative to an ArF excimer laser (193 nm), have been used as the base resin of chemically amplified resists. Here, the term "(meth)acrylate ester" is a generic term that includes either or both of the acrylate ester having a hydrogen atom bonded to the α-position and the methacrylate ester having a methyl group bonded to the α-position.

Examples of known acid dissociable, dissolution inhibiting groups include acetal groups such as ethoxyethyl groups, tertiary alkyl groups such as tert-butyl groups, as well as tert-butoxycarbonyl groups and tert-butoxycarbonylmethyl groups. Furthermore, structural units derived from tertiary ester compounds of (meth)acrylic acid, such as 2-alkyl-2-adamantyl(meth)acrylates, are widely used as the structural units containing an acid dissociable, dissolution inhibiting group within the resin component of conventional ArF resist compositions, as disclosed in Patent Document 1 listed below.

On the other hand, with respect to the exposure apparatus, techniques such as shortening the wavelength of the light source used, and increasing the diameter of the lens aperture (NA) (namely, increasing NA) are common. For example, for a resist resolution of approximately 0.5 µm, a mercury lamp for which the main spectrum is the 436 nm g-line is used, for a resolution of approximately 0.5 to 0.30 µm, a similar mercury lamp for which the main spectrum is the 365 nm i-line is used, for a resolution of approximately 0.3 to 0.15 µm, 248 nm KrF excimer laser light is used, and for resolutions of approximately 0.15 µm or less, 193 nm ArF excimer laser light is used. In order to achieve even greater miniaturization, the use of $F_2$ excimer laser (157 nm), $Ar_2$ excimer laser (126 nm), extreme ultraviolet radiation (EUV: 13 nm), electron beam (EB), and X-ray and the like is also being studied.

However, shortening the wavelength of the light source requires a new and expensive exposure apparatus. Furthermore, if the NA value is increased, since the resolution and the depth of focus exist in a trade-off type relationship, even if the resolution is increased, a problem arises in that the depth of focus is lowered.

Against this background, a method known as immersion exposure (immersion lithography) has been reported (for example, see Non-Patent Documents 1 to 3). In this method, exposure (immersion exposure) is conducted in a state where the region between the lens and the resist layer formed on a wafer, which has conventionally been filled with air or an inert gas such as nitrogen, is filled with a solvent (a immersion medium) that has a larger refractive index than the refractive index of air.

According to this type of immersion exposure, it is claimed that higher resolutions equivalent to those obtained using a shorter wavelength light source or a larger NA lens can be obtained using the same exposure light source wavelength, with no lowering of the depth of focus. Furthermore, immersion exposure can be conducted using existing exposure apparatus. As a result, it is expected that immersion exposure will enable the formation of resist patterns of higher resolution and superior depth of focus at lower costs. Accordingly, in the production of semiconductor devices, which requires enormous capital investment, immersion exposure is attracting considerable attention as a method that offers significant potential to the semiconductor industry, both in terms of cost and in terms of lithography properties such as resolution. Currently, water is mainly used as the immersion medium for immersion lithography.

[Patent Document 1] Japanese Unexamined Patent Application, First Publication No. Hei 10-161313

[Non-Patent Document 1] Journal of Vacuum Science & Technology B (U.S.), 1999, vol. 17, issue 6, pp. 3306 to 3309.

[Non-Patent Document 2] Journal of Vacuum Science & Technology B (U.S.), 2001, vol. 19, issue 6, pp. 2353 to 2356.

[Non-Patent Document 3] Proceedings of SPIE (U.S.), 2002, vol. 4691, pp. 459 to 465.

DISCLOSURE OF INVENTION

Means to Solve the Problems

However, many factors associated with immersion exposure remain unknown, and the formation of an ultra fine resist pattern of a level suitable for actual use remains problematic. For example, in immersion lithography, as described above, the immersion medium comes in contact with the resist film and the lens. As a result, lithography properties may be adversely affected by elution of a substance contained in the resist into the immersion medium, which cause degeneration of the resist film and lowering of the performance thereof, local change in the refractive index of the immersion medium caused by the eluted substance, and staining of the lens surface by the eluted substance. Therefore, problems are likely to occur including deterioration in the sensitivity, formation of T-top shaped resist patterns, roughening of the surface of the resist pattern, or swelling of the resist pattern. According to the studies of the present inventors, the elution of a substance markedly occurs when an acrylic resin having an acetal group as an acid dissociable, dissolution inhibiting group is used.

As a technique for suppressing the elution of a substance, improving the resistance of the resist film to the immersion medium (immersion medium resistance) can be considered. Currently, since aqueous solvent such as water is mainly considered as the immersion medium, it is presumed that enhancing the hydrophobicity of the resist film is effective in improving the resistance to the immersion medium.

However, changing the composition of the resist for enhancing the hydrophobicity of the resist film generally results in deterioration of the lithography properties. Therefore, achieving both of suppression of elution of a substance and lithography properties is difficult.

The present invention takes the above circumstances into consideration, with an object of providing a resist composition for immersion exposure and method of forming a resist pattern, which can suppress elution of a substance, and also exhibits excellent lithography properties.

Means to Solve the Problems

As a result of extensive and intensive studies of the present inventors, it has been found that the above-mentioned problems can be solved by a positive resist composition including two specific polymers. The present invention has been completed based on this finding.

Specifically, a first aspect of the present invention is a positive resist composition for immersion exposure including a resin component (A) which has acid dissociable, dissolution inhibiting groups and exhibits increased alkali solubility under action of acid and an acid-generator component (B) which generates acid upon exposure, the resin component (A) including a cyclic principal chain polymer (A1) and a non-cyclic principal chain polymer (A2) having a structural unit (a) derived from acrylic acid as a principal chain, and the non-cyclic principal chain polymer (A2) having a structural unit (a1) derived from an acrylate ester having an acid dissociable, dissolution inhibiting group (p1) represented by general formula (p1) shown below:

[Chemical Formula 1]

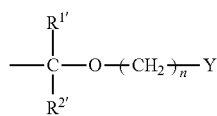

wherein $R^{1'}$ and $R^{2'}$ each independently represents a hydrogen atom or a lower alkyl group; n represents an integer of 0 to 3; and Y represents a lower alkyl group or an aliphatic cyclic group of 5 to 16 carbon atoms.

Further, a second aspect of the present invention is a method of forming a resist pattern, including: applying a positive resist composition for immersion exposure of the first aspect to a substrate to form a resist film on the substrate; subjecting the resist film to immersion exposure; and developing the resist film to form a resist pattern.

In the present description and claims, the term "structural unit" refers to a monomer unit that contributes to the formation of a resin (polymer).

An "alkyl group" includes a linear, branched or cyclic, monovalent saturated hydrocarbon, unless otherwise specified.

A "lower alkyl group" is an alkyl group of 1 to 5 carbon atoms.

The term "aliphatic" is a relative concept used in relation to the term "aromatic", and defines an organic group or compound that has no aromaticity. The term "aliphatic cyclic group" refers to a polycyclic or monocyclic organic group that has no aromaticity.

The term "exposure" is used as a general concept that includes irradiation with any form of radiation.

Effect of the Invention

According to the present invention, there are provided a resist composition for immersion exposure and method of forming a resist pattern, which can suppress elution of a substance, and also exhibits excellent lithography properties.

BEST MODE FOR CARRYING OUT THE INVENTION

Figure 1:
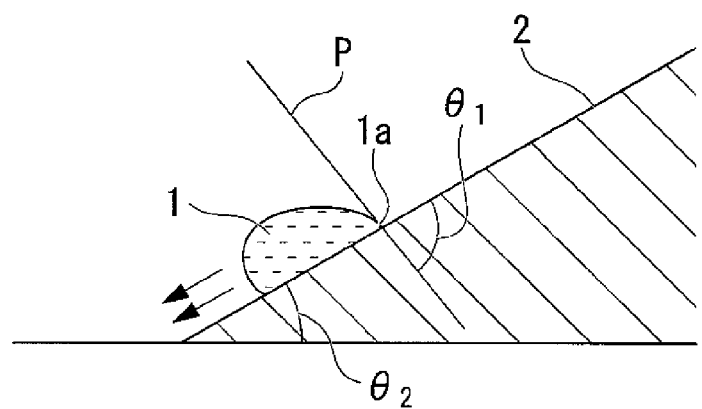
FIG. 1 is an explanatory diagram of receding angle ($\theta_1$) and sliding angle ($\theta_2$).

Hereinbelow, the present invention will be described in detail.

<<Positive Resist Composition for Immersion Exposure>>

The positive resist composition for immersion exposure according to the present invention includes a resin component (A) (hereafter referred to as the component (A)) which has acid dissociable, dissolution inhibiting groups and exhibits increased alkali solubility under action of acid, and an acid-generator component (B) (hereafter, frequently referred to as "component (B)") which generates acid upon exposure (irradiation of radial rays).

As the component (A) has acid dissociable, dissolution inhibiting groups, the component (A) is alkali insoluble prior to exposure. When acid generated from the component (B) upon exposure acts on the component (A), the acid dissociable, dissolution inhibiting groups are dissociated, and the alkali solubility of the entire component (A) is increased. Therefore, in the formation of a resist pattern, by conducting selective exposure of the resist, or by conducting exposure followed by post exposure bake (PEB), the exposed portions become alkali soluble, whereas the unexposed portions remain alkali insoluble, and hence, a positive resist pattern can be formed by alkali developing.

<Component (A)>

The component (A) includes a cyclic principal chain polymer (A1) (hereafter, frequently referred to as "polymer (A1)") and a non-cyclic principal chain polymer (A2) (hereafter, frequently referred to as "polymer (A2)") having a structural unit (a) derived from acrylic acid as a principal chain.

Each of the polymers will be described in detail below.

[Polymer (A1)]

In the present invention, a "cyclic principal chain polymer" refers to a polymer in which the structural units that constitute the polymer contain a monocyclic or polycyclic ring structure, and include structural units (hereafter referred to as cyclic principal chain structural units) in which at least one, and preferably two or more of the carbon atoms within that ring structure form the principal chain.

By virtue of including the polymer (A'1) having such a structure, not only can elution of a substance during immersion exposure be suppressed, but also the level of etching resistance is improved when the composition is used as a resist. The reason for this has not yet been elucidated, but it is presumed that including cyclic principal chain structural units results in an increase in carbon density.

Examples of these cyclic principal chain structural units include structural units derived from polycycloolefin (polycyclic olefin) and dicarboxylic anhydride-containing structural units exemplified in connection with the structural unit (a'4) described below. Among these, it is preferable to include structural units derived from polycycloolefins within the principal chain, as the resulting polymers exhibit excellent etching resistance when used as a resist.

A polycycloolefin is a polycyclic hydrocarbon which has a double bond (olefinic double bond) in the ring structure. A "structural unit derived from a polycycloolefin" refers to a structural unit which is formed by the cleavage of the olefinic double bond.

The hydrocarbon ring within the polycycloolefin preferably has 6 to 12 carbon atoms, more preferably 7 to 12 carbon atoms, and most preferably 7 to 10 carbon atoms.

The hydrocarbon ring within the polycycloolefin may or may not have a substituent. Examples of suitable substituent groups include lower alkyl groups of 1 to 5 carbon atoms, a fluorine atom, fluorinated lower alkyl groups of 1 to 5 carbon atoms, and an oxygen atom (=O).

Examples of the hydrocarbon ring include a polycycloalkane such as a bicycloalkane, tricycloalkane or tetracycloalkane which may or may not have a substituent. Specific examples include adamantane, norbornane, isobornane, tricyclodecane and tetracyclododecane. In consideration of high etching resistance and availability, norbornane or tetracyclododecane is particularly desirable.

In the present invention, the structural unit derived from a polycycloolefin preferably has a basic skeleton represented by general formula (a') shown below.

[Chemical Formula 2]

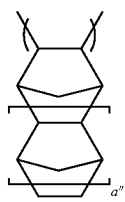

(a')

wherein a" represents 0 or 1.

General formula (a') represents the basic skeleton, and structural units having this basic skeleton not only include structural units having no substituent (structural units represented by general formula (a')), but also structural units having a substituent(s) on the ring skeleton, such as the structural units (a'1) to (a'3) described below.

Structural units represented by general formula (a') include structural units in which a"=0 (structural units derived from bicyclo[2.2.1]-2-hepterte (norbornene)) and structural units in which a"=1 (structural units derived from tetracyclo [4.4.0.1$^{2,5}$.1$^{7,10}$]-3-dodecene).

When the ring skeleton within general formula (a') has a substituent(s), the number of substituents bonded to the ring skeleton and the bonding position of the substituents are not particularly limited.

The number of substituents is preferably 1 to 3, and most preferably 1.

The bonding position of the substituent(s) is preferably the carbon atom most remote from the carbon atoms constituting the principal chain. For example, when a" is 0, the substituent(s) is preferably bonded to the 5th and/or 6th position of the ring skeleton (bicyclo[2.2.1]-2-heptene(norbornene)), and when a" is 1, the substituent(s) is preferably bonded to the 8th and/or 9th position of the ring skeleton (tetracyclo[4.4.0.1$^{2,5}$.1$^{7,10}$]-3-dodecene).

In addition to the cyclic principal chain structural units, the polymer (A1) may also include a structural unit (a) derived from acrylate acid, such as those units described below in relation to the polymer (A2), although in terms of achieving favorable effects for the present invention, the proportion of cyclic principal chain structural units within the polymer (A1), based on the combined total of all the structural units that constitute the polymer (A1), is preferably within a range of from 50 to 100 mol %, and more preferably from 80 to 100 mol %.

The polymer (A1) preferably has a fluorine atom.

As a polymer having a fluorine atom, a structural unit in which a part of the hydrogen atoms bonded to the carbon atoms constituting the basic ring represented by general formula (a') above is substituted with fluorine atoms or fluorine-containing groups can be exemplified.

Examples of fluorine-containing groups include alkyl groups in which a part or all of the hydrogen atoms are substituted with fluorine atoms; and groups containing fluorine atoms (e.g., groups represented by general formula (a'31) described below) among the groups exemplified for R$^{64}$ (an organic group having an alkali-soluble group) within the structural unit (a'3) described below.

In the present invention, as the below-described polymer (A2) has acid dissociable, dissolution inhibiting groups, the polymer (A1) may or may not have acid dissociable, dissolution inhibiting groups. However, it is preferable that the polymer (A1) have acid dissociable, dissolution inhibiting groups, as the resist pattern shape and resolution becomes excellent.

As the acid dissociable, dissolution inhibiting group, any of the groups that have been proposed as acid dissociable, dissolution inhibiting groups for the base resins of chemically amplified resists can be used, provided the group has an alkali dissolution-inhibiting effect that renders the entire polymer (A1) alkali-insoluble prior to exposure, and then following dissociation, causes the entire polymer (A1) to change to an alkali-soluble state. Generally, groups that form either a cyclic or chain-like tertiary alkyl ester with a carboxyl group, and group (p1) represented by below-described general formula (p1) are the most widely known.

Here, a "tertiary alkyl ester" describes a structure in which an ester is formed by substituting the hydrogen atom of a carboxyl group with a chain-like or cyclic tertiary alkyl group, preferably an alkyl group of 1 to 20 carbon atoms, and the tertiary carbon atom within the chain-like or cyclic tertiary alkyl group is bonded to the terminal oxygen atom of the carbonyloxy group (—C(O)—O—). In this tertiary alkyl ester, the action of acid causes cleavage of the bond between the oxygen atom and the tertiary carbon atom.

The chain-like or cyclic alkyl group may have a substituent.

Hereafter, for the sake of simplicity, groups that exhibit acid dissociability as a result of the formation of a tertiary alkyl ester with a carboxyl group are referred to as "tertiary alkyl ester-type acid dissociable, dissolution inhibiting groups".

Examples of suitable tertiary alkyl ester-type acid dissociable, dissolution inhibiting groups include aliphatic branched acid dissociable, dissolution inhibiting groups and acid dissociable, dissolution inhibiting groups that contain an aliphatic cyclic group.

As the aliphatic branched acid dissociable, dissolution inhibiting group, a tertiary alkyl group of 4 to 8 carbon atoms is preferable, and specific examples include a tert-butyl group, tert-amyl group and tert-heptyl group.

Examples of "acid dissociable, dissolution inhibiting groups that contain an aliphatic cyclic group" include the same aliphatic cyclic groups as those exemplified as the "aliphatic cyclic group" for Y in below-described general formula (p1), which contain a tertiary carbon atom within the ring skeleton of the cycloalkyl group (e.g., a 1-methyl-1-cyclohexyl group, 1-ethyl-1-cyclohexyl group, a 2-methyl-2-adamantyl group and a 2-ethyl-2-adamantyl group); and aliphatic cyclic groups having a tertiary carbon atom-containing branched alkylene group (preferably a branched alkylene group of 3 to 15 carbon atoms) bonded thereto (e.g., a dialkylmethylene group having a 1-adamantyl group bonded thereto).

The group represented by general formula (p1) is the so-called acetal-type acid dissociable, dissolution inhibiting group, and will be described below in detail. As an example of such an acetal-type acid dissociable, dissolution inhibiting group, a group which forms a cyclic or chain-like alkoxyalkyl ester with a carboxy group can be exemplified.

A "cyclic or chain-like alkoxyalkyl ester" is an ester formed by substituting the hydrogen atom of a carboxy group with an alkoxyalkyl group (preferably an alkoxyalkyl group of 2 to 30 carbon atoms), and has a structure in which the alkoxyalkyl group is bonded to the terminal oxygen atom of the carbonyloxy group (—C(O)—O—).

When acid acts on the acetal-type acid dissociable, dissolution inhibiting group, the bond between the acetal-type acid dissociable, dissolution inhibiting group and the oxygen atom to which the acetal-type, acid dissociable, dissolution inhibiting group is bonded is broken.

The polymer (A1) preferably has a structural unit in which the basic skeleton represented by general formula (a') above has the terminal hydrogen atom of the carboxy group substituted with an acid dissociable, dissolution inhibiting group. As the acid dissociable, dissolution inhibiting group, a tertiary alkyl ester-type acid dissociable, dissolution inhibiting group is particularly desirable.

It is particularly desirable that the polymer (A1) has a structural unit (a'1) described below, as the effects of the present invention become excellent.

Structural Unit (a'1)

The structural unit (a'1) is a structural unit represented by general formula (a'1) shown below.

[Chemical Formula 3]

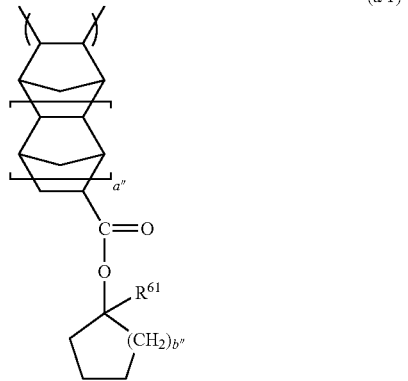

(a'1)

wherein $R^{61}$ represents a lower alkyl group; a" represents 0 or 1; and b" represents an integer of 1 to 3.

The structural unit (a'1) represented by general formula (a'1) is a structural unit derived from norbornane or tetracyclododecane which has a 1-alkyl($R^{61}$ in formula (a'1), 2 to 5 carbon atoms)-1-cycloalkyl(5 to 8 carbon atoms)oxycarbonyl group as a substituent on the 5th position (when a"=0) or 8th position (when a"=1) of the ring.

In formula (a'1), $R^{61}$ represents a lower alkyl group, and may be linear or branched. As the lower alkyl group, a lower alkyl group of 1 to 5 carbon atoms is preferable, and examples thereof include a methyl group, ethyl group, propyl group, isopropyl group, n-butyl group, isobutyl group, pentyl group, isopentyl group and neopentyl group. The lower alkyl group is preferably a methyl group or an ethyl group.

a" represents 0 or 1, and is preferably 0 in terms of industrial availability.

b" represents an integer of 1 to 3, and is preferably 1 or 2 in terms of industrial availability and ease in synthesis.

In the present invention, it is particularly desirable that $R^{61}$ in formula (a'1) represent an ethyl group and b" represent 2. That is, it is particularly desirable that the structural unit (a'1) has a 1-ethyl-1-cyclohexyl group as the acid dissociable, dissolution inhibiting group, as the effects of the present invention become excellent.

As the structural unit (a'1), one type may be used alone, or two or more types may be used in combination.

In the polymer (A1), the amount of the structural unit (a'1) based on the combined total of all structural units constituting the polymer (A1) is preferably 5 to 80 mol %, more preferably 10 to 50 mol %, and still more preferably 10 to 30 mol %. By making the amount of the structural unit (a'1) at least as large as the lower limit of the above-mentioned range, a pattern can be formed using a resist composition prepared from the polymer (A1). On the other hand, by making the amount of the structural unit (a'1) no more than the upper limit of the above-mentioned range, a good balance can be achieved with the other structural units.

A monomer for deriving the structural unit (a'1) can be synthesized, for example, by reacting (meth)acrylic acid-1-alkyl(2 or more carbon atoms)-1-cycloalkyl(5 to 8 carbon atoms) ester with cyclopentadiene or dicyclopentadiene by a conventional Diels-Alder reaction, as described in Japanese Unexamined Patent Application, First Publication No. 2000-235263.

Structural Unit (a'2)

The polymer (A1) preferably has a structural unit (a'2) represented by general formula (a'2) shown below, as well as the structural unit (a'1).

When the polymer (A1) has the structural unit (a'2), lithography properties such as resolution are improved. The reason for this has not yet been elucidated, but is presumed that the hydrophilicity of the entire polymer (A1) is enhanced by the structural unit (a'2), and when a resist composition is prepared from the polymer (A1), the affinity of a resist film formed by using the resist composition for an alkali developing solution is increased.

[Chemical Formula 4]

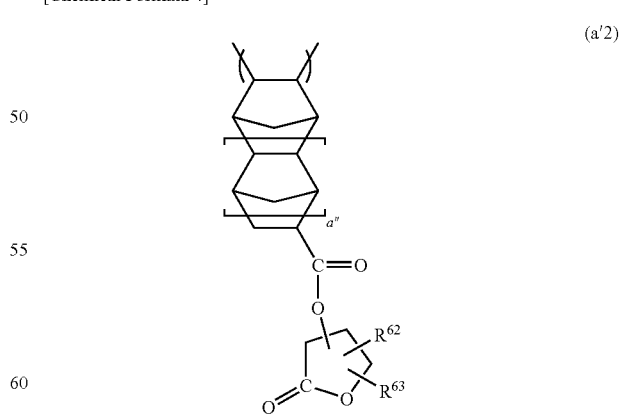

(a'2)

wherein $R^{62}$ and $R^{63}$ each independently represents a hydrogen atom or a lower alkyl group; and a" represents 0 or 1.

The structural unit (a'2) represented by general formula (a'2) is the structural unit (a') derived from a polycycloolefin in which a butyrolactone having $R^{62}$ and $R^{63}$ on the 5th position (when a''=0) or 8th position (when a''=1) and having a hydrogen atom removed therefrom is bonded through an oxycarbonyl group.

In formula (a'2), a'' is as defined for a'' in formula (a'1) above.

$R^{62}$ and $R^{63}$ each independently represents a hydrogen atom or a lower alkyl group, and is preferably a hydrogen atom in terms of industrial availability.

The lower alkyl group for $R^{62}$ and $R^{63}$ may be linear or branched. As the lower alkyl group, a lower alkyl group of 1 to 5 carbon atoms is preferable, and examples thereof include a methyl group, ethyl group, propyl group, isopropyl group, n-butyl group, isobutyl group, pentyl group, isopentyl group and neopentyl group.

As the structural unit (a'2), one type may be used alone, or two or more types may be used in combination.

In the polymer (A1), the amount of the structural unit (a'2) based on the combined total of all structural units constituting the polymer (A1) is preferably 5 to 80 mol %, more preferably 10 to 50 mol %, and still more preferably 10 to 30 mol %. By making the amount of the structural unit (a'2) at least as large as the lower limit of the above-mentioned range, the effect of using the structural unit (a'2) can be satisfactorily achieved. On the other hand, by making the amount of the structural unit (a'2) no more than the upper limit of the above-mentioned range, a good balance can be achieved with the other structural units.

Structural Unit (a'3)

The polymer (A1) preferably has a structural unit (a'3) represented by general formula (a'3) shown below, as well as the structural unit (a'1) or the structural units (a'1) and (a'2). When the polymer (A1) has the structural unit (a'3), the effect of suppressing elution of a substance during immersion exposure is further improved. The reason for this has not yet been elucidated, but is presumed that by virtue of the structural unit (a'3) including an alkali-soluble group, particularly a fluorine-containing alkali-soluble group, the below-described contact angle and receding angle are further improved. Further, by including the structural unit (a'3), resolution, adhesion to a substrate, and the like are improved.

[Chemical Formula 5]

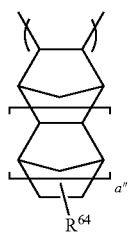

(a'3)

wherein $R^{64}$ represents an organic group containing an alkali-soluble group; and a'' represents 0 or 1.

In formula (a'3), a'' is as defined for a'' in formula (a'1) above.

$R^{64}$ represents an organic group containing an alkali-soluble group.

In the present description and claims, the term "organic group" refers to a group containing at least a carbon atom.

An alkali-soluble group is a group which enhances the alkali solubility of the polymer, and is preferably a group having a pKa (wherein Ka is an acid dissociation constant) relatively small as a phenolic hydroxyl group. The pKa of the alkali-soluble group is not particularly limited, but is preferably in the range of 6 to 12.

Specific examples of alkali-soluble groups include groups having —OH on the terminal thereof, such as a hydroxyl group (a phenolic hydroxyl group or an alcoholic hydroxyl group) and a carboxy group. Preferable examples of alkali-soluble groups include an alcoholic hydroxyl group; a hydroxyalkyl group in which the hydrogen atom(s) bonded to the carbon atom having the hydroxyl group bonded thereto (i.e., carbon atom on the α-position) is substituted with an electron-withdrawing group (an electron-withdrawing group-substituted hydroxyalkyl group); and a carboxy group. Among these, an electron-withdrawing group-substituted hydroxyalkyl group or a carboxy group is preferable.

In the electron-withdrawing group-substituted hydroxyalkyl group, the alkyl group is preferably linear or branched. The number of carbon atoms of the electron-withdrawing group-substituted hydroxyalkyl group is not particularly limited, but is preferably 1 to 20, more preferably 4 to 16, and most preferably 4 to 12.

The number of hydroxy groups is not particularly limited, but is preferably 1.

Examples of suitable electron-withdrawing groups include halogen atoms and halogenated alkyl groups.

Suitable halogen atoms include a fluorine atom and chlorine atom, and a fluorine atom is preferable.

In a halogenated alkyl group, the halogen may be the same as the above halogen atoms. The alkyl group is preferably a lower alkyl group of about 1 to 5 carbon atoms, more preferably a methyl group or ethyl group, and most preferably a methyl group. Specific examples of halogenated alkyl groups include a trifluoromethyl group, difluoromethyl group, monofluoromethyl group, and perfluoroethyl group, and a trifluoromethyl group is particularly desirable.

The number of electron-withdrawing groups may be either 1 or 2, and is preferably 2.

More specific examples of preferable electron-withdrawing group-substituted hydroxyalkyl group include groups that include a structure represented by a formula —$CR^{71}R^{72}OH$, wherein $R^{71}$ and $R^{72}$ each independently represents an alkyl group, a halogen atom, or a halogenated alkyl group, with the proviso that at least one of $R^{71}$ and $R^{72}$ represents an electron-withdrawing group selected from amongst halogen atoms and halogenated alkyl groups.

Herein, the halogen atoms and halogenated alkyl groups are the same as those described above. Examples of alkyl groups include lower alkyl groups such as a methyl group, ethyl group, and propyl group.

Of these possibilities, groups in which the electron-withdrawing group is a fluorine atom or fluorinated alkyl group (i.e., fluorinated hydroxyalkyl groups) are preferable, and groups in which both $R^{71}$ and $R^{72}$ are fluorinated alkyl groups are particularly desirable, and perfluoroalkyl groups in which all hydrogen atoms of the alkyl group has been substituted with fluorine atoms are preferable.

As $R^{64}$, a group represented by general formula (a'31) shown below is particularly desirable, as the effect of suppressing elution of a substance during immersion exposure becomes excellent.

[Chemical Formula 6]

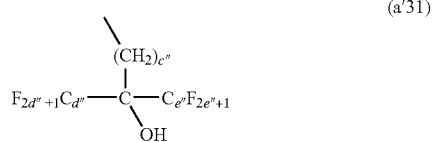

(a'31)

wherein c'' represents an integer of 1 to 5; and d'' and e'' each independently represents an integer of 1 to 5.

In formula (a'31), c'' represents an integer of 1 to 5, preferably an integer of 1 to 3, and most preferably 1.

d'' and e'' each independently represents an integer of 1 to 5, and preferably an integer of 1 to 3. In terms of synthesizing and effects, it is particularly desirable that d'' and e'' represents 1.

As the structural unit (a'3), one type may be used alone, or two or more types may be used in combination.

In the polymer (A1), the amount of the structural unit (a'3) based on the combined total of all structural units constituting the polymer (A1) is preferably 10 to 90 mol %, more preferably 20 to 80 mol %, and still more preferably 50 to 70 mol %. By making the amount of the structural unit (a'3) at least as large as the lower limit of the above-mentioned range, the effect of using the structural unit (a'3) can be satisfactorily achieved. On the other hand, by making the amount of the structural unit (a'3) no more than the upper limit of the above-mentioned range, a good balance can be achieved with the other structural units.

Other Structural Units (a'4)

The polymer (A1) may also include other structural units (a'4) besides the aforementioned structural units (a'1) to (a'3), provided the inclusion of these other units does not impair the effects of the present invention.

As the structural unit (a'4), any other structural unit which cannot be classified as one of the above structural units (a'1) to (a'3), and which is derived from a monomer that is copolymerizable with the monomers that give rise to the structural units (a'1) to (a'3) can be used without any particular limitations.

As the structural unit (a'4), any structural unit derived from a conventional compound having an ethylenic double bond can be used depending on the intended purpose of the polymer.

Specific examples of structural unit (a'4) include the structural unit (a) derived from acrylic acid, which is exemplified in connection with the polymer (A2) described below; a structural unit containing a dicarboxylic acid anhydride; a structural unit derived from a polycycloolefin having no substituents; and a structural unit derived from a polycycloolefin having an aliphatic polycyclic group as a substituent.

A "structural unit containing a dicarboxylic anhydride" refers to a structural unit having the structure "—C(O)—O—C(O)—". Examples of such a structural unit include structural units containing a monocyclic or polycyclic acid anhydride. Specific examples include a structural unit derived from a monocyclic maleic anhydride, as shown in formula (a'41) below; a structural unit derived from a polycyclic maleic anhydride, as shown in formula (a'42) below; and a structural unit derived from itaconic acid, as shown in formula (a'43) below.

[Chemical Formula 7]

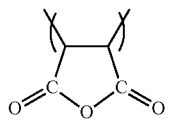
(a'41)

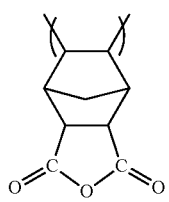
(a'42)

-continued
[Chemical Formula 8]

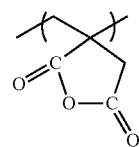
(a'43)

Examples of structural units derived from a polycycloolefin having no substituents include units derived from bicyclo[2.2.1]-2-heptene(norbornene) and tetracyclo[4.4.0.1$^{2,5}$.1$^{7,10}$]-3-dodecene.

Furthermore, examples of structural unit derived from a polycycloolefin having an aliphatic polycyclic group as a substituent include the aforementioned structural units derived from a polycycloolefin having no substituents which have a polycyclic group such as a tricyclodecanyl group, adamantyl group, or tetracyclododecanyl group as a substituent on the ring.

In the polymer (A1), the combination and relative proportions of the structural units (a' 1) to (a'4) can be selected and adjusted depending on the characteristics required. In consideration of lithography properties of the resist pattern formed, such as the shape of the resist pattern, etching resistance and resolution, the polymer (A1) preferably has at least the structural units (a'1) and (a'3), and more preferably the structural units (a'1) to (a'3).

When the polymer (A1) is a binary polymer that contains the structural unit (a'1) and the structural unit (a'3), but does not include the structural unit (a'2) (but may include a structural unit (a'4)), in terms of achieving favorable effects for the present invention and enabling more ready control during synthesis of the polymer, the respective proportions (molar ratios) of each of the structural units, based on the combined total of all the structural units that constitute the polymer (A1), are preferably within a range of from 5 to 80 mol % and more preferably from 10 to 60 mol % for the structural unit (a'1), and preferably within a range of from 5 to 95 mol % and more preferably from 10 to 60 mol % for the structural unit (a'3).

When the polymer (A1) is a ternary polymer that includes the structural units (a'1) to (a'3) (and may also include a structural unit (a'4)), the respective proportions (molar ratios) of each of the structural units, based on the combined total of all the structural units that constitute the polymer (A1), are preferably within a range of from 5 to 80 mol %, and more preferably from 10 to 50 mol % for the structural unit (a'1), preferably within a range from 5 to 80 mol %, and more preferably from 10 to 50 mol % for the structural unit (a'2), and preferably within a range from 10 to 90 mol % and more preferably from 20 to 80 mol % for the structural unit (a'3). Such proportions yield superior levels of etching resistance and pattern shape, and also provide excellent lithography properties such as resolution.

In the present invention, as the polymer (A1), a polymer including the three structural units represented by general formula (A1-11) shown below is particularly desirable. Such a polymer is excellent in the effect of suppressing elution of a substance during immersion exposure, etching resistance, resist pattern shape, lithography properties such as resolution, and adhesion to a substrate. Further, such a polymer is advantageous in that pattern collapse hardly occurs.

[Chemical Formula 9]

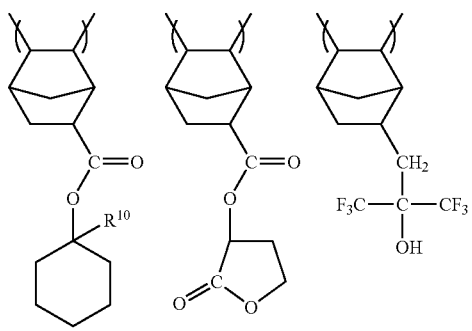

(A1-11)

wherein R[10] represents a methyl group or an ethyl group.

The polymer (A1) can be obtained, for example, by a conventional radical polymerization or the like of the monomers corresponding with each of the structural units, using a radical polymerization initiator such as azobisisobutyronitrile (AIBN).

Furthermore, in the polymer (A1), by using a chain transfer agent such as HS—$CH_2$—$CH_2$—$CH_2$—$C(CF_3)_2$—OH, a —$C(CF_3)_2$—OH group can be introduced at the terminals of the polymer (A1). Such a copolymer having introduced a hydroxyalkyl group in which some of the hydrogen atoms of the alkyl group are substituted with fluorine atoms is effective in reducing developing defects and LER (line edge roughness: unevenness of the side walls of a line pattern).

The weight average molecular weight (the polystyrene equivalent weight average molecular weight determined by gel permeation chromatography, this also applies below) of the polymer (A1) is preferably no higher than 20,000, and is even more preferably 15,000 or lower. Weight average molecular weights of no more than 20,000 offer various advantages, including excellent etching resistance, resistance to swelling of the resist pattern during developing, and favorable resistance to pattern collapse.

There are no particular restrictions on the lower limit, although from the viewpoints of achieving favorable resolution and favorable solubility in organic solvents, the weight average molecular weight is preferably at least 3,000, and is even more preferably 5,000 or higher.

The polymer (A1) may include either a single polymer or a combination of two or more different polymers.

[Polymer (A2)]

The polymer (A2) is a non-cyclic principal chain polymer having a structural unit (a) derived from acrylic acid as a principal chain.

In the present description and claims, the term "non-cyclic principal chain polymer" refers to polymers which are not classified as the aforementioned "cyclic principal chain polymer". That is, a non-cyclic principal chain polymer has no carbon atoms constituting a ring, which constitute the principal chain of the non-cyclic principal chain polymer.

The term "acrylic acid" is a general concept including acrylic acid in a narrow sense (i.e., $CH_2$=CHCOOH), and derivatives thereof in which a part or all of the hydrogen atoms are substituted with other groups or atoms.

Examples of acrylic acid derivatives include α-substituted acrylic acid in which a substituent (an atom other than hydrogen, or a group) is bonded to the carbon atom on the α-position of acrylic acid in a narrow sense; and acrylate esters in which the hydrogen atom of the carboxy group of the aforementioned acrylic acid is substituted with an organic group.

The "α-position (the carbon atom on the α-position)" of acrylic acid refers to the carbon atom having the carbonyl group bonded thereto, unless specified otherwise.

As the substituent for an α-substituted acrylic acid, a halogen atom, a lower alkyl group or a halogenated lower alkyl group can be mentioned.

Examples of the halogen atom for the substituent on the α-position include a fluorine atom, a chlorine atom, a bromine atom and an iodine atom, and a fluorine atom is particularly desirable.

Specific examples of the lower alkyl group for the substituent at the α-position include linear or branched alkyl groups such as a methyl group, ethyl group, propyl group, isopropyl group, n-butyl group, isobutyl group, tert-butyl group, pentyl group, isopentyl group, and neopentyl group.

The lower alkyl group within the halogenated alkyl group for the substituent on the α-position is the same as the lower alkyl groups mentioned above. Further, the halogen atom within the halogenated alkyl group is the same as the halogen atoms mentioned above.

In the present invention, it is preferable that a hydrogen atom, a halogen atom, a lower alkyl group or a halogenated lower alkyl group is bonded to the α-position of acrylic acid, and more preferably a hydrogen atom, a fluorine atom, a lower alkyl group or a fluorinated lower alkyl group. In terms of industrial availability, a hydrogen atom or a methyl group is particularly desirable.

The term "structural unit derived from acrylic acid" refers to a structural unit which is formed by the cleavage of the ethylenic double bond of acrylic acid.

The term "structural unit derived from an acrylate ester" refers to a structural unit which is formed by the cleavage of the ethylenic double bond of an acrylate ester.

Examples of the structural unit (a) include structural units represented by general formula (a) shown below.

[Chemical Formula 10]

(a)

wherein R represents a hydrogen atom, a halogen atom, a lower alkyl group or a halogenated lower alkyl group; and X represents a hydrogen atom or a monovalent organic group.

As the halogen atom, lower alkyl group and halogenated lower alkyl group for R, the same as the halogen atom, lower alkyl group and halogenated lower alkyl group which may be bonded to the α-position of the aforementioned acrylate ester can be exemplified.

The organic group for X is not particularly limited, and examples thereof include groups bonded to the ester-side chain of the acrylate ester of the below-mentioned structural units (a1) to (a4) (e.g., an acid dissociable, dissolution inhibiting group, a lactone ring-containing group, a polar group-containing aliphatic hydrocarbon group and polycyclic aliphatic hydrocarbon group).

In the polymer (A2), the amount of the structural unit (a) based on the combined total of all structural units constituting the polymer (A2) is preferably 50 mol % or more, more preferably 70 mol % or more. In terms of the effects of the present invention, it is particularly desirable that the polymer (A2) consist of the structural unit (a) derived from acrylic acid.

The expression "consist of the structural unit (a)" means that the principal chain of the polymer (A2) is constituted of only the structural unit (a), and does not include any other structural units.

Structural Unit (a1)

It is necessary that the polymer (A2) have a structural unit (a1) derived from an acrylate ester having an acid dissociable, dissolution inhibiting group (p1) represented by general formula (p1) shown below. By including the structural unit (a1), excellent lithography properties can be obtained.

[Chemical Formula 11]

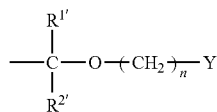
(p1)

wherein $R^{1\prime}$ and $R^{2\prime}$ each independently represents a hydrogen atom or a lower alkyl group; n represents an integer of 0 to 3; and Y represents a lower alkyl group or an aliphatic cyclic group.

In general formula (p1) above, n is preferably an integer of 0 to 2, more preferably 0 or 1, and most preferably 0.

As the lower alkyl group for $R^{1\prime}$ and $R^{2\prime}$, the same as the lower alkyl groups for R above can be exemplified. As the lower alkyl group for $R^{1\prime}$ and $R^{2\prime}$, a methyl group or ethyl group is preferable, and a methyl group is particularly desirable.

In the present invention, it is preferable that at least one of $R^{1\prime}$ and $R^{2\prime}$ be a hydrogen atom. That is, it is preferable that the acid dissociable, dissolution inhibiting group (p1) is a group represented by general formula (p1-1) shown below.

[Chemical Formula 12]

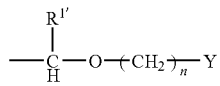
(p1-1)

wherein $R^{1\prime}$, n and Y are the same as $R^{1\prime}$, n and Y in general formula (p1) above.

As the lower alkyl group for Y, the same as the lower alkyl groups for R above can be exemplified.

As the aliphatic cyclic group for Y, any of the aliphatic monocyclic/polycyclic groups which have been proposed for conventional ArF resists and the like can be appropriately selected for use.

The aliphatic cyclic group may be either saturated or unsaturated, but is preferably saturated.

Examples of aliphatic acyclic groups include monocyclic groups of 5 to 8 carbon atoms and polycyclic groups of 6 to 16 carbon atoms. As monocyclic groups of 5 to 8 carbon atoms, groups in which one or more hydrogen atoms have been removed from a monocycloalkane can be exemplified, and specific examples include groups in which one or more hydrogen atoms have been removed from cyclopentane or cyclohexane. As polycyclic groups of 6 to 16 carbon atoms, groups in which one or more hydrogen atoms have been removed from a polycycloalkane such as a bicycloalkane, tricycloalkane or tetracycloalkane can be exemplified, and specific examples include groups in which one or more hydrogen atoms have been removed from adamantane, norbornane, isobornane, tricyclodecane or tetracyclododecane. Among these, an aliphatic polycyclic group is preferable. An adamantyl group, norbornyl group or tetracyclododecanyl group is preferable industrially, and an adamantyl group is particularly desirable.

The aliphatic cyclic group may or may not have a substituent. Examples of suitable substituents groups include lower alkyl groups of 1 to 5 carbon atoms, a fluorine atom, fluorinated lower alkyl groups of 1 to 5 carbon atoms, and an oxygen atom (=O). Among these, it is preferable that the aliphatic cyclic group have a lower alkyl group of 1 to 5 carbon atoms, and a methyl group is particularly desirable.

The aliphatic cyclic group may be a hydrocarbon group (alicyclic group) in which the basic ring excluding substituents is constituted from only carbon and hydrogen, or a heterocyclic group in which a part of the carbon atoms constituting the aliphatic ring is replaced by a hetero atom (e.g., an oxygen atom and a nitrogen atom). The aliphatic cyclic group is preferably an alicyclic group.

More specific examples of aliphatic cyclic groups for Y include those having the structures represented by chemical formulas shown below.

[Chemical Formula 13]

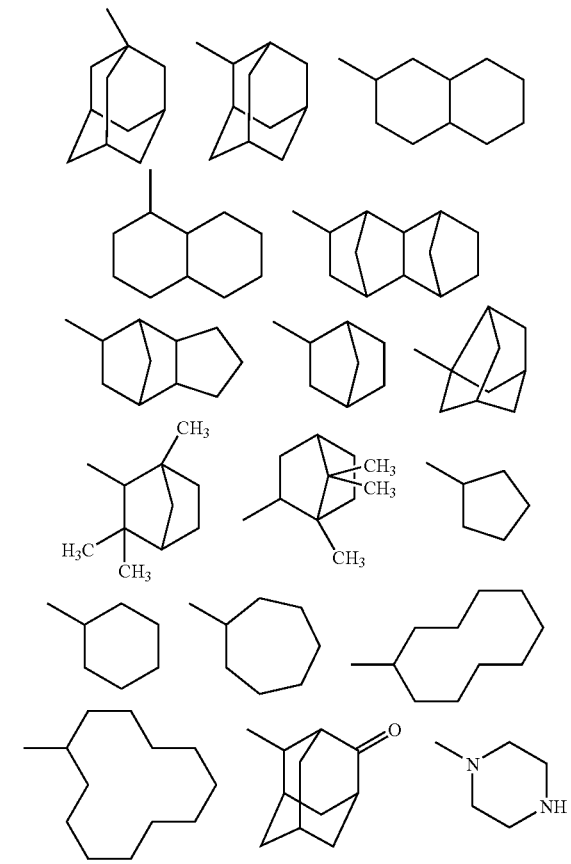

The acid dissociable, dissolution inhibiting group (p1) within the structural unit (a1) exhibits the effect of inhibiting alkali dissolution to render the entire polymer (A2) alkali insoluble prior to dissociation, and following dissociation, changes the entire polymer (A2) to an alkali-soluble state.

Generally, the acid dissociable, dissolution inhibiting group (p1) is substituted with the terminal hydrogen atom of the carboxy group of acrylic acid (i.e., the acid dissociable, dissolution inhibiting group is bonded to the terminal oxygen atom of the carbonyloxy group (—C(O)—O—)) to form an ester.

As the structural unit (a1), it is preferable to use at least one structural unit selected from the group consisting of structural units represented by general formula (a1-0-1) shown below and structural units represented by general formula (a1-0-2) shown below.

[Chemical Formula 14]

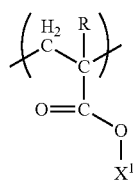
(a1-0-1)

wherein R represents a hydrogen atom, a halogen atom, a lower alkyl group, or a halogenated lower alkyl group; and $X^1$ represents an acid dissociable, dissolution inhibiting group (p 1).

[Chemical Formula 15]

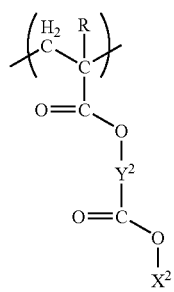
(a1-0-2)

wherein R represents a hydrogen atom, a halogen atom, a lower alkyl group, or a halogenated lower alkyl group; $X^2$ represents an acid dissociable, dissolution inhibiting group (p1); and $Y^2$ represents an alkylene group or an aliphatic cyclic group.

In general formula (a1-0-1) above, the halogen atom, lower alkyl group and halogenated lower alkyl group for R are the same as the halogen atom, lower alkyl group or halogenated lower alkyl group which can be bonded to the α-position of the aforementioned acrylate ester.

$X^1$ represents an acid dissociable, dissolution inhibiting group (p1).

In general formula (a1-0-2) above, the halogen atom, lower alkyl group and halogenated lower alkyl group for R are the same as the halogen atom, lower alkyl group or halogenated lower alkyl group which can be bonded to the α-position of the aforementioned acrylate ester. The group $X^2$ is as defined for $X^1$ in the formula (a1-0-1).

$Y^2$ is an alkylene group of 1 to 4 carbon atoms or a divalent aliphatic cyclic group.

When $Y^2$ is a divalent aliphatic cyclic group, the same as those exemplified above in connection with the explanation of "aliphatic cyclic group" can be used, except that two hydrogen atoms have been removed therefrom.

More specifically, the structural unit (a1) is preferably at least one structural unit selected from the group consisting of structural units represented by general formula (a1-2) shown below and structural units represented by general formula (a1-4) shown below.

[Chemical Formula 16]

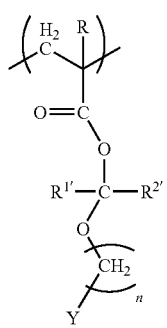
(a1-2)

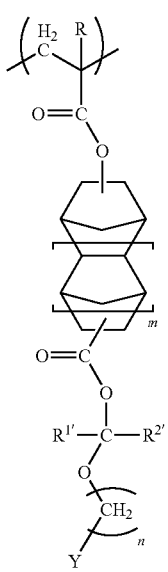
(a1-4)

wherein R represents a hydrogen atom, halogen atom, lower alkyl group, or halogenated lower alkyl group; $R^{1'}$, $R^{2'}$ and Y are the same as $R^{1'}$, $R^{2'}$ and Y defined in general formula (p1) above; n represents an integer of 0 to 3; and m represents 0 or 1.

Specific examples of structural units represented by general formulas (a1-2) and (a1-4) are shown below.

[Chemical Formula 17]

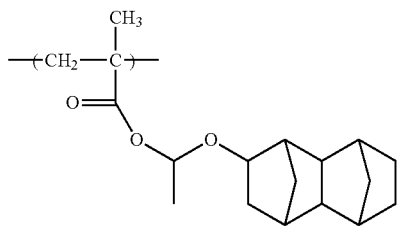
(a1-2-1)

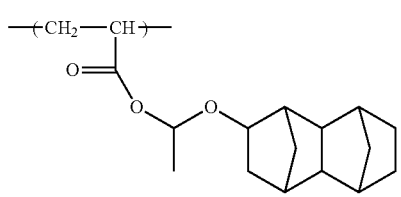
(a1-2-2)

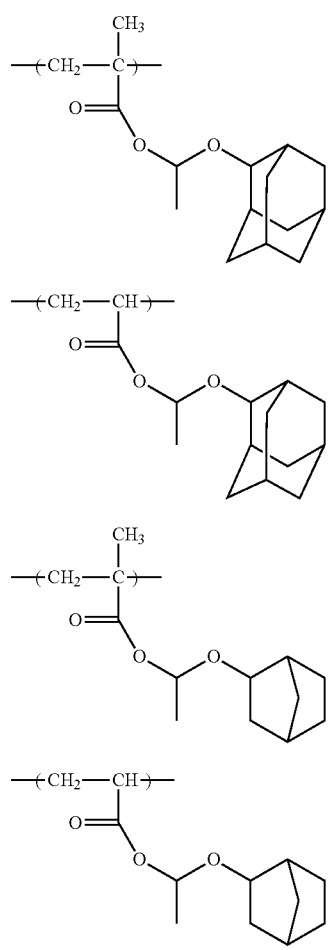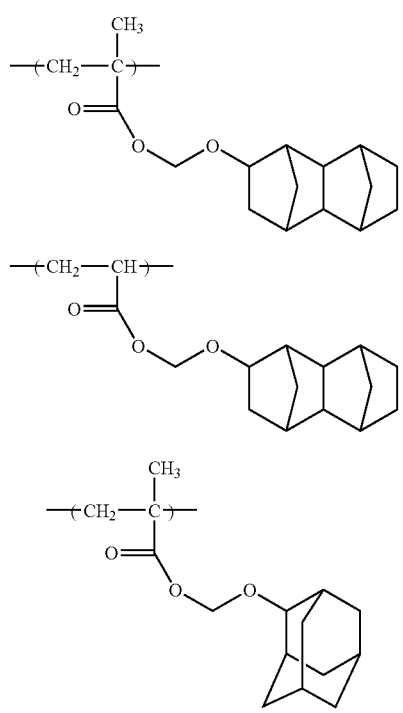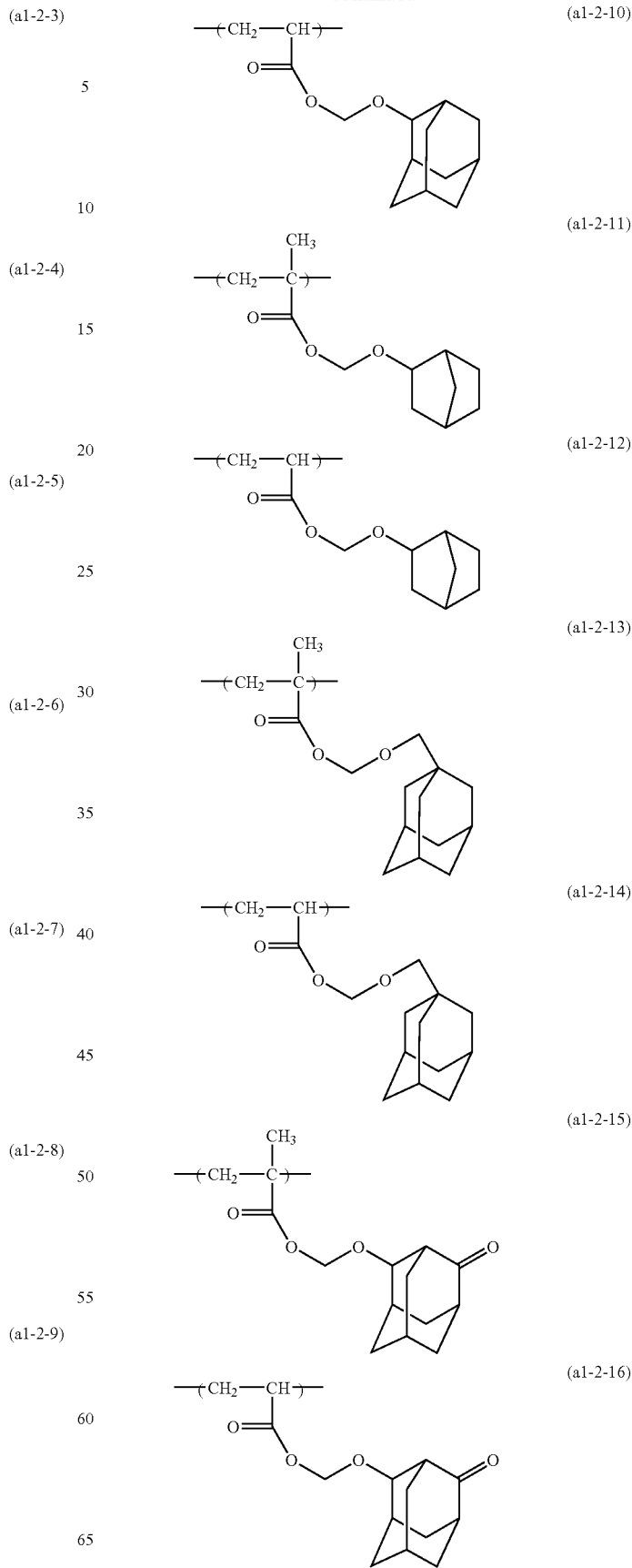

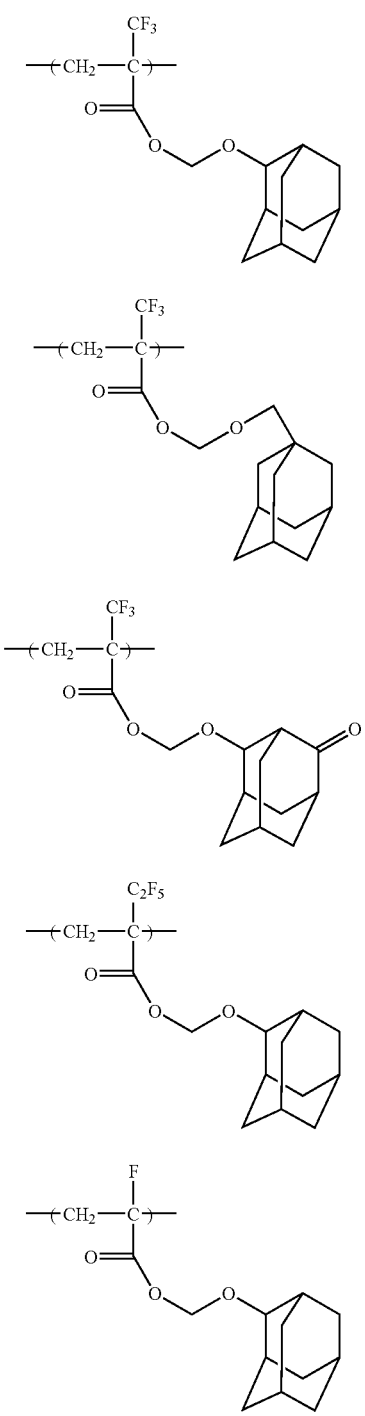
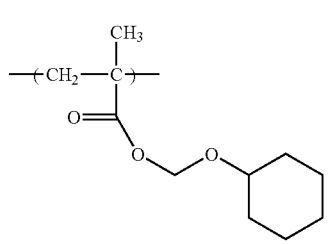
[Chemical Formula 19]
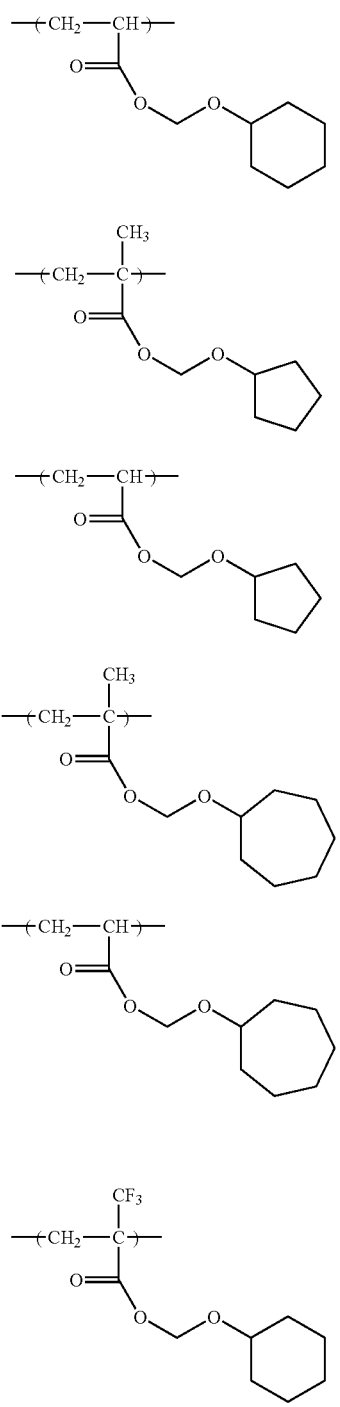

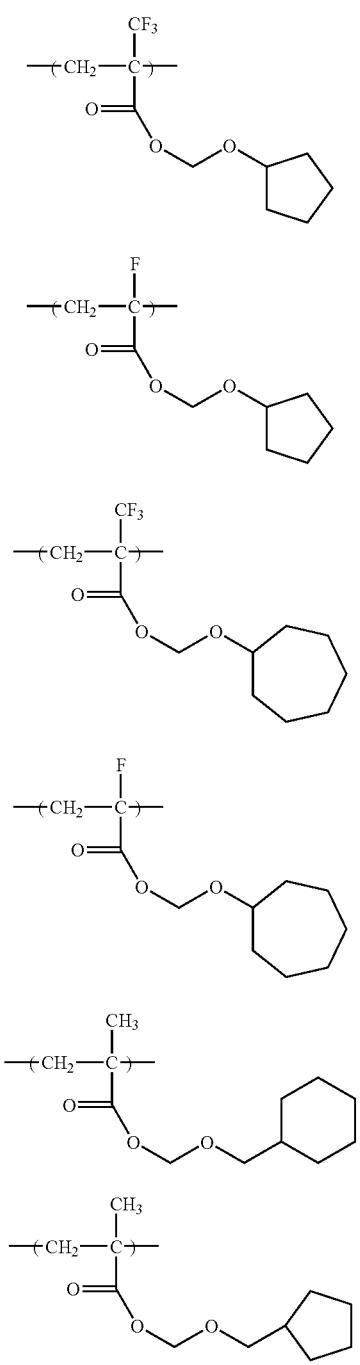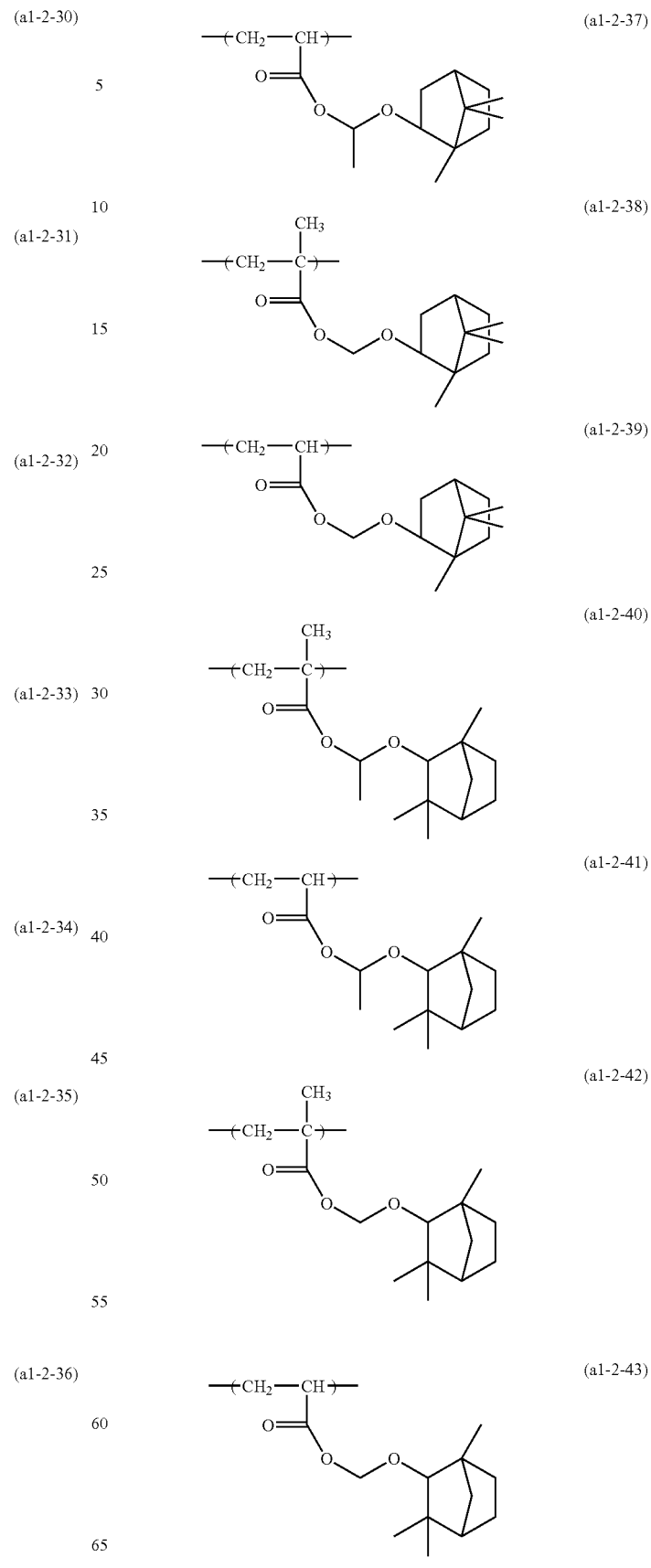

-continued
[Chemical Formula 21]
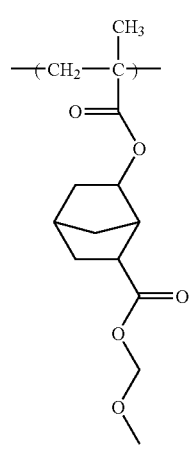
(a1-4-1)
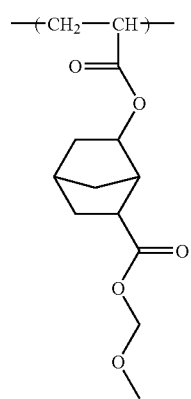
(a1-4-2)
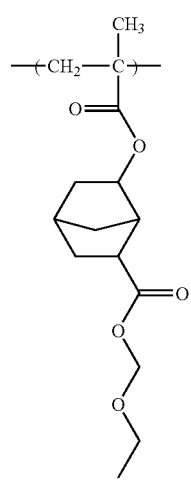
(a1-4-3)
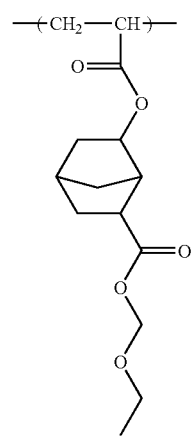
(a1-4-4)
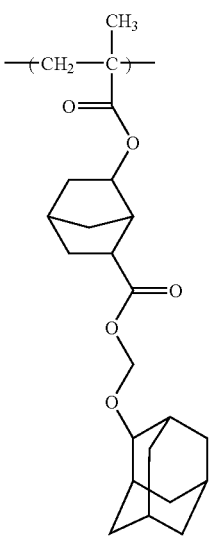
(a1-4-5)
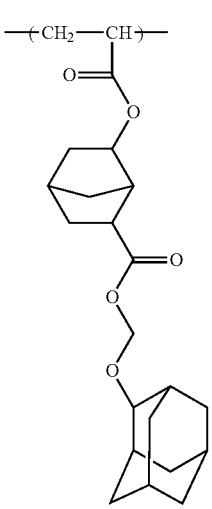
(a1-4-6)

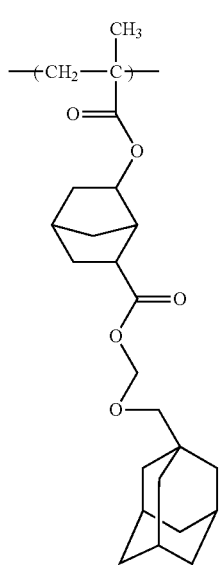
(a1-4-7)
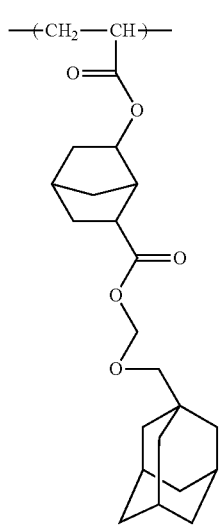
(a1-4-8)
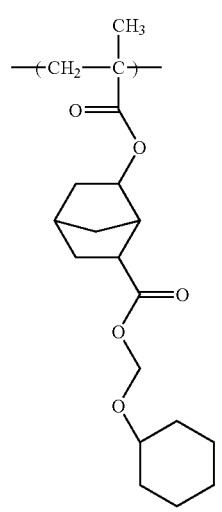
(a1-4-9)
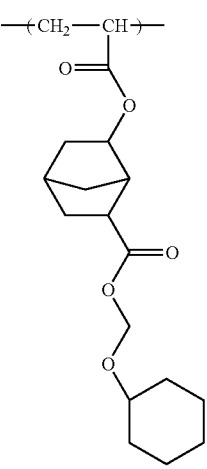
(a1-4-10)
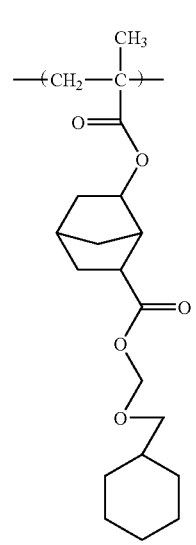
(a1-4-11)
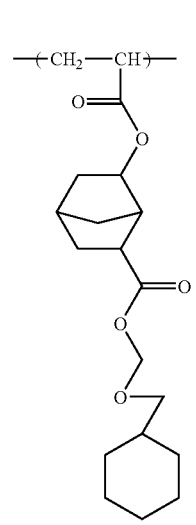
(a1-4-12)

(a1-4-13)
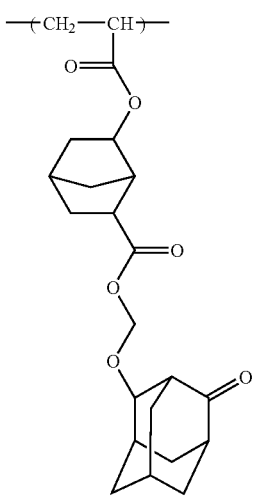
(a1-4-14)
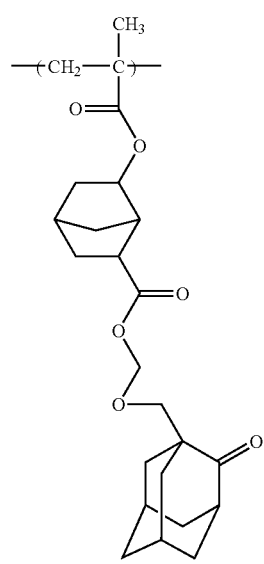
(a1-4-15)
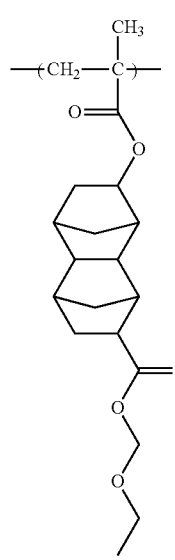
[Chemical Formula 22]
(a1-4-16)
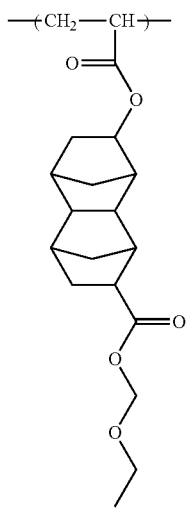
(a1-4-17)
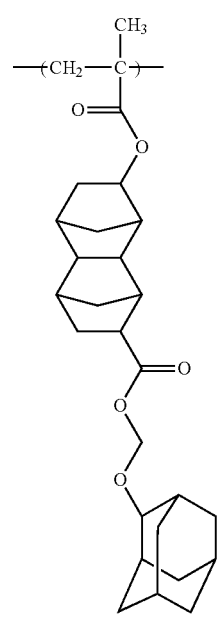
(a1-4-18)
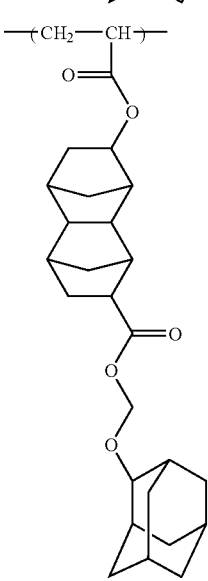

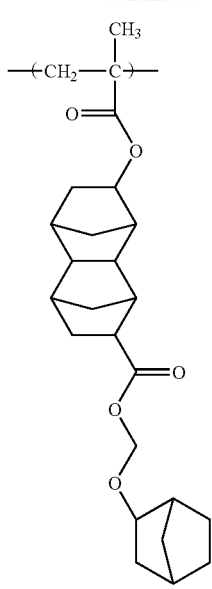
(a1-4-19)
(a1-4-20)
(a1-4-21)
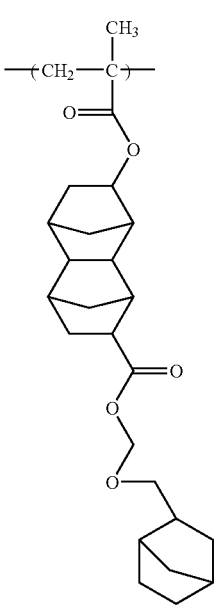
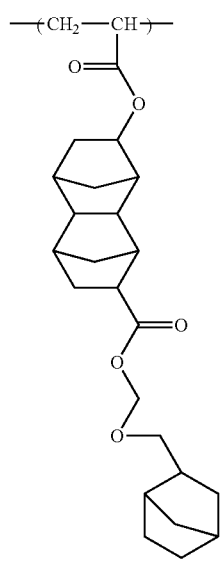
(a1-4-22)
(a1-4-23)
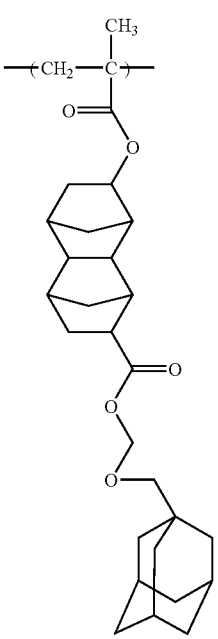

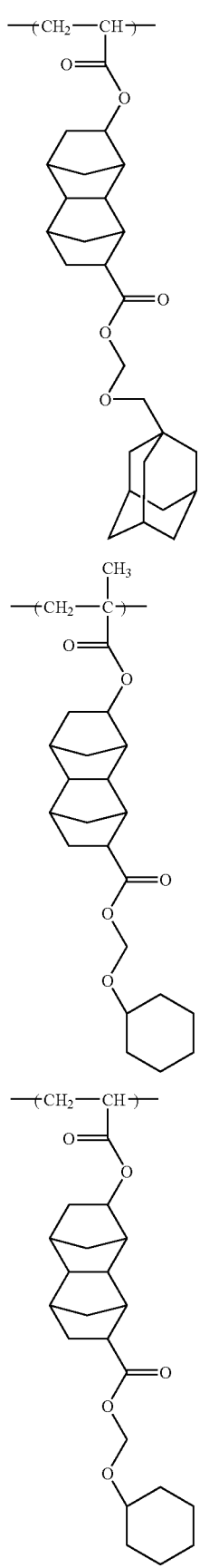

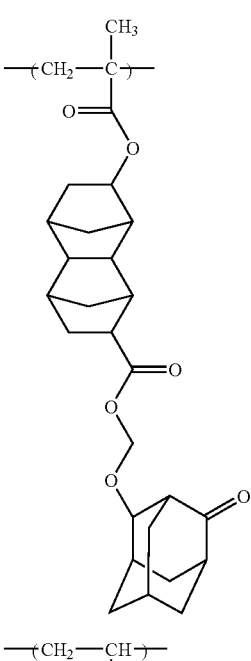

(a1-4-29)

(a1-4-30)

As the structural unit (a1), one type may be used alone, or two or more types may be used in combination.

Among these, structural units represented by general formula (a1-2) are preferable, structural units represented by formulas (a1-2-36) to (a1-2-39) are more preferable, and a structural unit represented by formula (a1-2-36) or (a1-2-37) is particularly desirable.

In the polymer (A2), the amount of the structural unit (a1) based on the combined total of all structural units constituting the polymer (A2) is preferably 10 to 80 mol %, more preferably 20 to 70 mol %, and still more preferably 25 to 50 mol %. By making the amount of the structural unit (a1) at least as large as the lower limit of the above-mentioned range, a pattern can be easily formed using a resist composition prepared from the polymer (A2). On the other hand, by making the amount of the structural unit (a1) no more than the upper limit of the above-mentioned range, a good balance can be achieved with the other structural units.

Structural Unit (a2)

The polymer (A2) preferably has a structural unit (a2) derived from an acrylate ester having a lactone-containing cyclic group, as well as the structural unit (a1).

The term "lactone-containing cyclic group" refers to a cyclic group including one ring containing a —O—C(O)— structure (lactone ring). The term "lactone ring" refers to a single ring containing a —O—C(O)— structure, and this ring is counted as the first ring. A lactone-containing cyclic group in which the only ring structure is the lactone ring is referred to as a monocyclic group, and groups containing other ring structures are described as polycyclic groups regardless of the structure of the other rings.

When the polymer (A2) includes the structural unit (a2) containing a lactone cyclic group, the lactone-containing cyclic group of the structural unit (a2) is effective in improving the adhesion between a substrate and a resist film formed from a resist composition of the present invention, and enhancing the hydrophilicity for a developing solution.

As the structural unit (a2), there is no particular limitation, and an arbitrary structural unit may be used.

Specific examples of lactone-containing monocyclic groups include groups in which one hydrogen atom has been removed from γ-butyrolactone. Specific examples of lactone-containing polycyclic groups include groups in which one hydrogen atom has been removed from a lactone ring-containing bicycloalkane, tricycloalkane or tetracycloalkane.

More specifically, examples of the structural unit (a2) include structural units represented by general formulas (a2-1) to (a2-5) shown below.

[Chemical Formula 23]

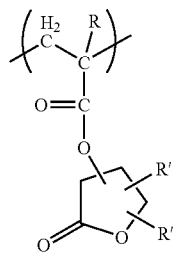

(a2-1)

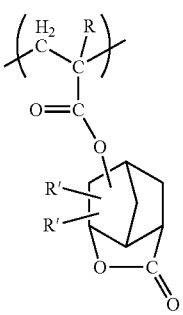

(a2-2)

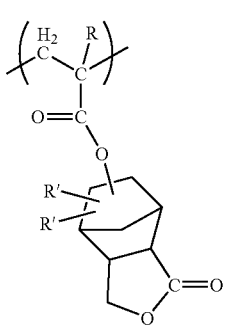

(a2-3)

-continued (a2-4)
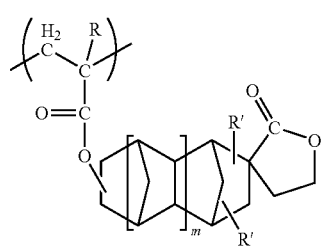

(a2-5)
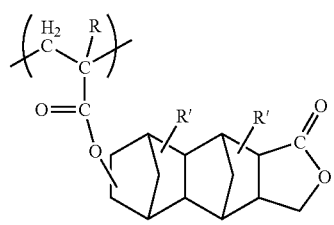

wherein R represents a hydrogen atom, a halogen atom, a lower alkyl group or a halogenated lower alkyl group; R' represents a hydrogen atom, a lower alkyl group or an alkoxy group of 1 to 5 carbon atoms; and m represents 0 or 1.

In general formulas (a2-1) to (a2-5), R is the same as R in the structural unit (a1).

The lower alkyl group for R' is the same as the lower alkyl group for R in the structural unit (a1).

In the structural units represented by general formulas (a2-1) to (a2-5), in consideration of industrial availability, R' is preferably a hydrogen atom.

Specific examples of structural units represented by general formulas (a2-1) to (a2-5) above are shown below.

[Chemical Formula 24]

(a2-1-1)
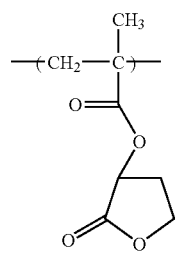

(a2-1-2)
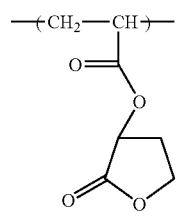

(a2-1-3)
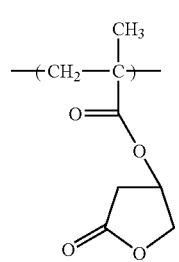

-continued (a2-1-4)
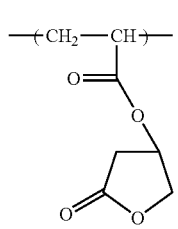

(a2-1-5)
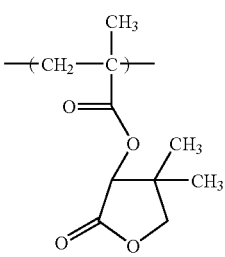

(a2-1-6)
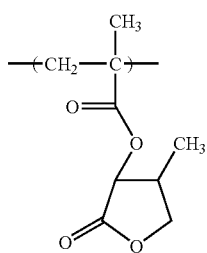

[Chemical Formula 25]

(a2-2-1)
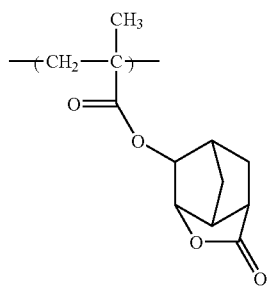

(a2-2-2)
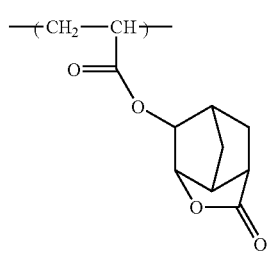

(a2-2-3)
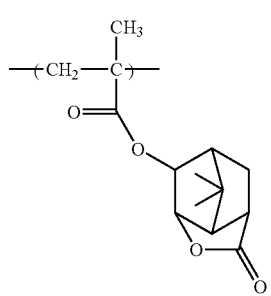

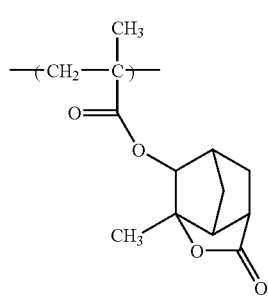 (a2-2-4)
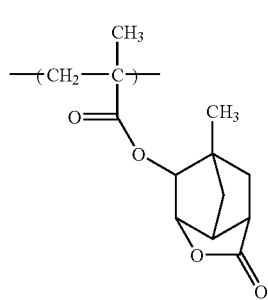 (a2-2-5)
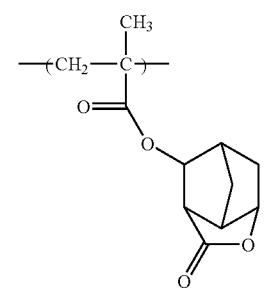 (a2-2-6)
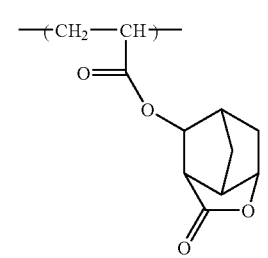 (a2-2-7)
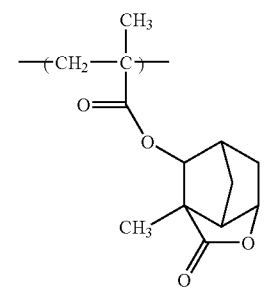 (a2-2-8)
[Chemical Formula 26]
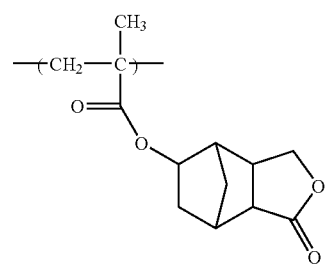 (a2-3-1)
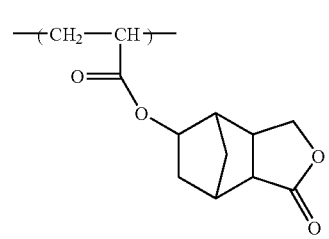 (a2-3-2)
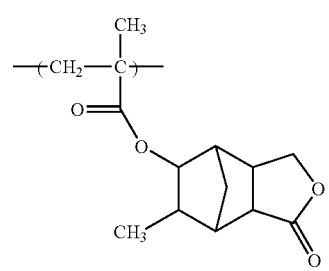 (a2-3-3)
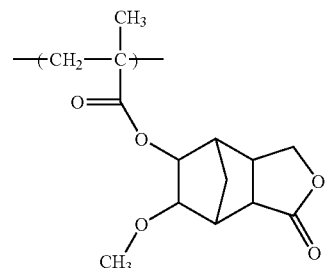 (a2-3-4)
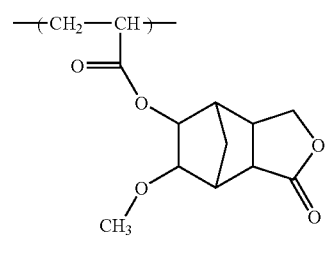 (a2-3-5)
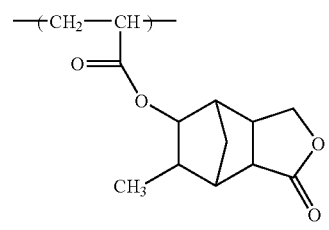 (a2-3-6)

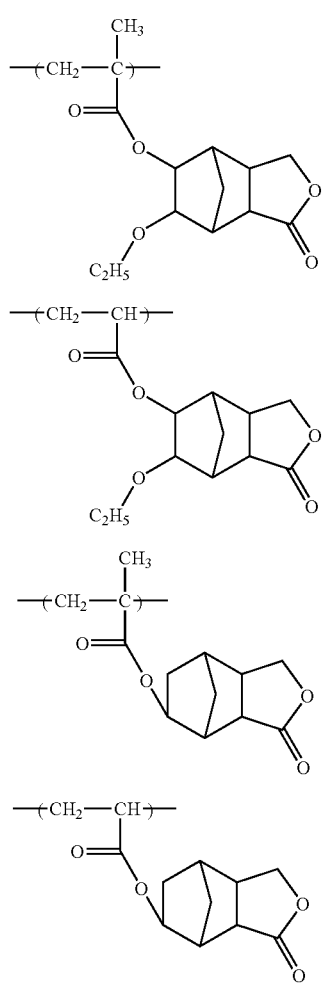
(a2-3-7)
(a2-3-8)
(a2-3-9)
(a2-3-10)
[Chemical Formula 27]
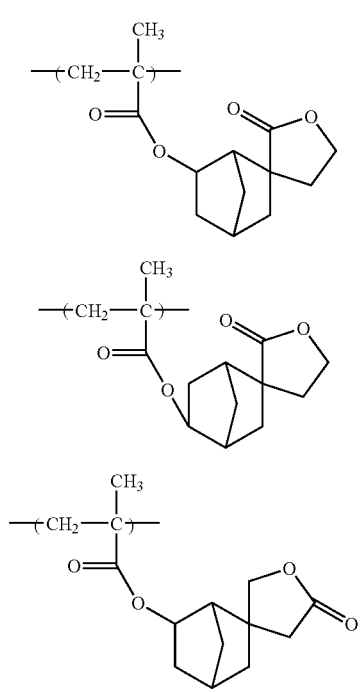
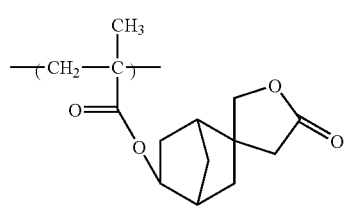
(a2-4-4)
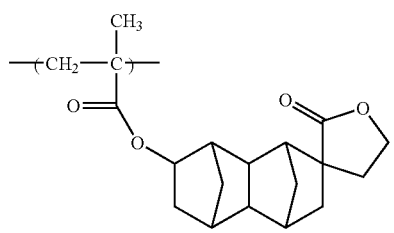
(a2-4-5)
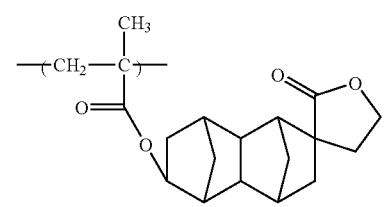
(a2-4-6)
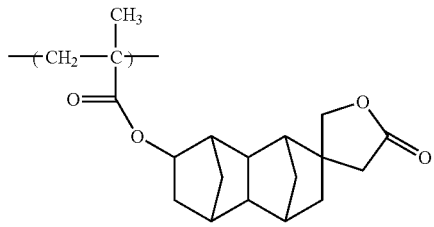
(a2-4-7)
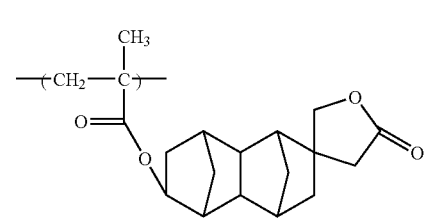
(a2-4-8)
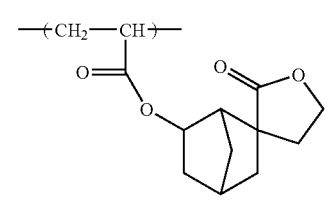
(a2-4-9)
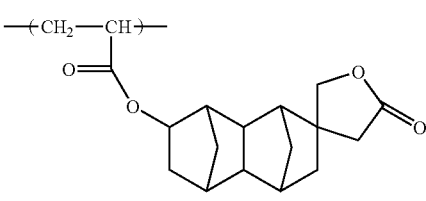
(a2-4-10)

(a2-4-11) 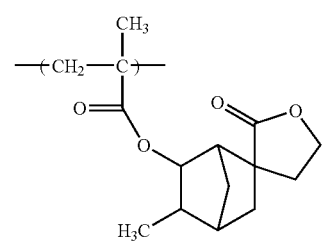

(a2-4-12) 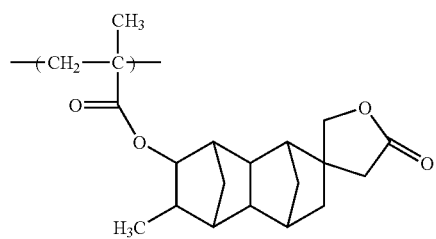

[Chemical Formula 28]

(a2-5-1) 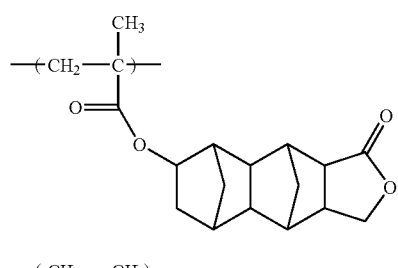

(a2-5-2) 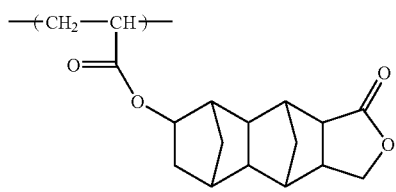

(a2-5-3) 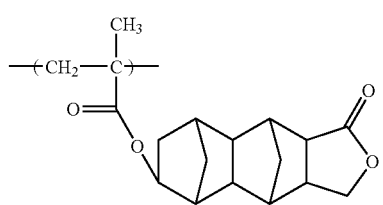

(a2-5-4) 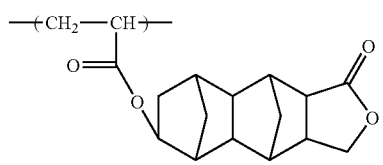

(a2-5-5) 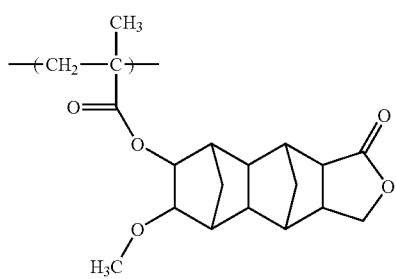

(a2-5-6) 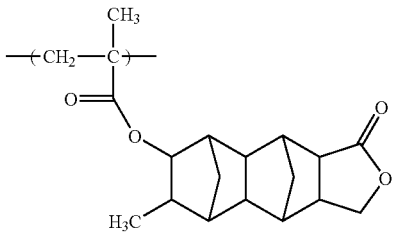

Of these, at least one structural unit selected from the group consisting of general formulas (a2-1) to (a2-3) is preferable, and a structural unit represented by general formula (a2-2) is particularly desirable. Specifically, it is preferable to use at least one structural unit selected from the group consisting of formulas (a2-1-1), (a2-1-2), (a2-2-1), (a2-2-2), (a2-3-1), (a2-3-2), (a2-3-9) and (a2-3-10), and it is particularly desirable to use the structural unit represented by formula (a2-2-1) or (a2-2-2).

In the polymer (A2), as the structural unit (a2), one type of structural unit may be used, or two or more types may be used in combination.

In the polymer (A2), the amount of the structural unit (a2) based on the combined total of all structural units constituting the polymer (A2) is preferably 5 to 70 mol %, more preferably 10 to 60 mol %, and still more preferably 20 to 60 mol %. By making the amount of the structural unit (a2) at least as large as the lower limit of the above-mentioned range, the effect of using the structural unit (a2) can be satisfactorily achieved. On the other hand, by making the amount of the structural unit (a2) no more than the upper limit of the above-mentioned range, a good balance can be achieved with the other structural units.

Structural Unit (a3)

The polymer (A2) preferably has a structural unit (a3) derived from an acrylate ester having a polar group-containing aliphatic hydrocarbon group, as well as the structural unit (a1) and the structural unit (a2). By including the structural unit (a3), the hydrophilicity of the polymer (A2) is improved, and hence, the affinity of the polymer (A2) for a developing solution is improved. As a result, the alkali solubility of the exposed portions improves, which contributes to favorable improvements in the resolution.

Examples of the polar group include a hydroxyl group, cyano group, carboxyl group, or hydroxyalkyl group in which some of the hydrogen atoms of the alkyl group have been substituted with fluorine atoms (wherein the alkyl group preferably has 1 to 5 carbon atoms), although a hydroxyl group is particularly desirable.

Examples of the aliphatic hydrocarbon group include linear or branched hydrocarbon groups (preferably alkylene groups) of 1 to 10 carbon atoms, and polycyclic aliphatic hydrocarbon groups (polycyclic groups). These polycyclic groups can be selected appropriately from the multitude of groups that have been proposed for the resins of resist compositions designed for use with ArF excimer lasers. The polycyclic groups preferably have 7 to 30 carbon atoms.

Of the various possibilities, structural units derived from acrylate esters having an aliphatic polycyclic group that contains a hydroxyl group, cyano group, carboxyl group or a hydroxyalkyl group in which some of the hydrogen atoms of the alkyl group have been substituted with fluorine atoms are particularly desirable. Examples of suitable polycyclic groups include groups in which one or more hydrogen atoms have been removed from a bicycloalkane, tricycloalkane or tetracycloalkane or the like. Specific examples include groups in which one or more hydrogen atoms have been removed from a polycycloalkane such as adamantane, norbornane, isobornane, tricyclodecane or tetracyclododecane.

Of these polycyclic groups, groups in which two or more hydrogen atoms have been removed from adamantane, groups in which two or more hydrogen atoms have been removed from norbornane, and groups in which two or more hydrogen atoms have been removed from tetracyclododecane are preferred industrially.

When the aliphatic hydrocarbon group within the polar group-containing aliphatic hydrocarbon group is a linear or branched hydrocarbon group of 1 to 10 carbon atoms, the structural unit (a3) is preferably a structural unit derived from a hydroxyalkyl ester of acrylic acid. On the other hand, when the hydrocarbon group is a polycyclic group, structural units represented by formulas (a3-1), (a3-2) and (a3-3) shown below are preferable.

[Chemical Formula 29]

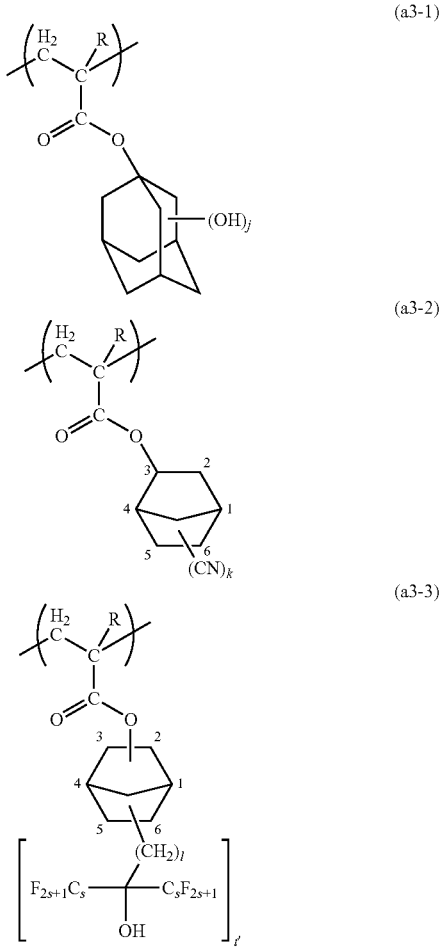

wherein R represents a hydrogen atom, a halogen atom, a lower alkyl group or a halogenated lower alkyl group; j is an integer of 1 to 3; k is an integer of 1 to 3; t' is an integer of 1 to 3; l is an integer of 1 to 3; and s is an integer of 1 to 3.

In formula (a3-1), j is preferably 1 or 2, and more preferably 1. When j is 2, it is preferable that the hydroxyl groups be bonded to the 3rd and 5th positions of the adamantyl group. When j is 1, it is particularly desirable that the hydroxyl group be bonded to the 3rd position of the adamantyl group.

j is preferably 1, and it is particularly desirable that the hydroxyl group be bonded to the 3rd position of the adamantyl group.

In formula (a3-2), k is preferably 1. The cyano group is preferably bonded to the 5th or 6th position of the norbornyl group.

In formula (a3-3), t' is preferably 1, l is preferably 1 and s is preferably 1. Further, in formula (a3-3), it is preferable that a 2-norbornyl group or 3-norbornyl group be bonded to the terminal of the carboxy group of the acrylic acid. The fluorinated alkyl alcohol is preferably bonded to the 5th or 6th position of the norbornyl group.

As the structural unit (a3), one type of structural unit may be used, or two or more types may be used in combination.

In the polymer (A2), the amount of structural unit (a3) based on the combined total of all structural units constituting the polymer (A2) is preferably 5 to 50 mol %, more preferably 5 to 40 mol %, and still more preferably 5 to 25 mol %.

Other Structural Units

The polymer (A2) may further contain a structural unit (a4) which is other than the above-mentioned structural units (a1) to (a3), as long as the effects of the present invention are not impaired.

As the structural unit (a4), any other structural unit which is not a cyclic principal chain structural unit and cannot be classified as one of the above structural units (a1) to (a3) can be used without any particular limitations, and any of the multitude of conventional structural units used within resist resins for ArF excimer lasers or KrF excimer lasers (and particularly for ArF excimer lasers) can be used.

As the structural unit other than the above-mentioned structural units (a1) to (a3), a structural unit derived from an acrylate ester having a non-acid-dissociable aliphatic polycyclic group is preferable. Examples of this polycyclic group within the structural unit (a4) include the same groups as those described above in relation to the aforementioned structural unit (a1), and any of the multitude of conventional polycyclic groups used within the resin component of resist compositions for ArF excimer lasers or KrF excimer lasers (and particularly for ArF excimer lasers) can be used.

In consideration of industrial availability and the like, at least one polycyclic group selected from amongst a tricyclodecanyl group, adamantyl group, tetracyclododecanyl group, isobornyl group, and norbornyl group is particularly desirable. These polycyclic groups may have at least one of the hydrogen atoms substituted with a linear or branched alkyl group of 1 to 5 carbon atoms.

Specific examples of the structural unit (a4) include units with structures represented by general formulas (a4-1) to (a4-5) shown below.

[Chemical Formula 30]

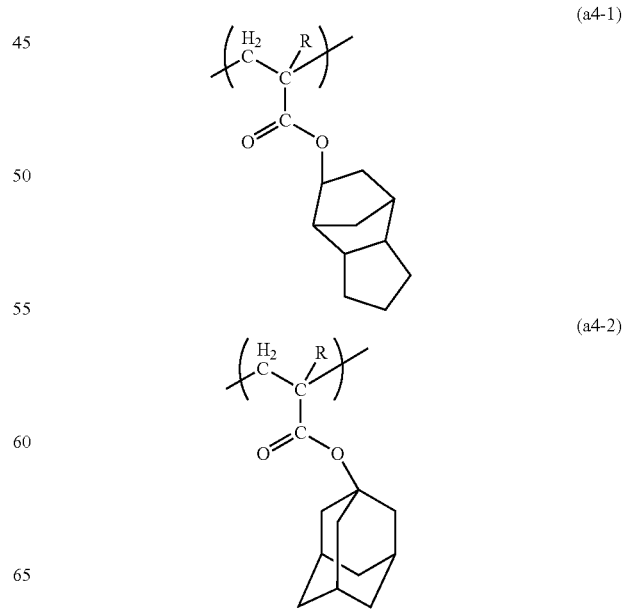

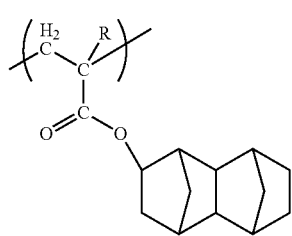 (a4-3)

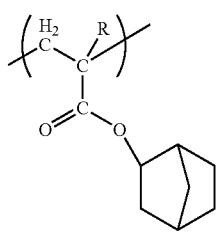 (a4-4)

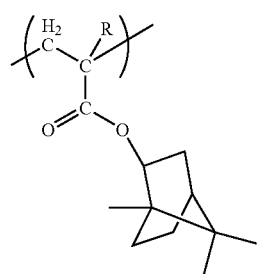 (a4-5)

wherein R represents a hydrogen atom, a halogen atom, a lower alkyl group or a halogenated lower alkyl group.

When the polymer (A2) contains the structural unit (a4), the amount of the structural unit (a4) based on the combined total of all the structural units that constitute the polymer (A2) is preferably within a range from 1 to 30 mol %, and more preferably from 10 to 20 mol %.

In the present invention, the polymer (A2) is preferably a copolymer including the structural units (a1), (a2) and (a3). Examples of such a copolymer include a copolymer consisting of the structural units (a1), (a2) and (a3), and a copolymer consisting of the structural units (a1), (a2), (a3) and (a4).

In the present invention, as the polymer (A2), a copolymer including the three structural units shown in general formula (A2-11) below is particularly desirable, as the effects of the present invention become excellent.

[Chemical Formula 31]

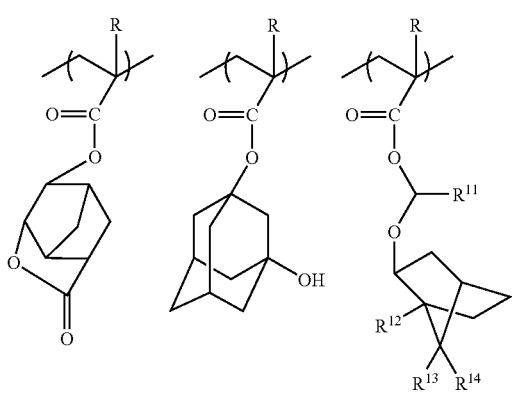 (A2-11)

wherein R represents a hydrogen atom, a halogen atom, a lower alkyl group or a halogenated lower alkyl group; $R^{11}$ represents a hydrogen atom or a methyl group; and each of $R^{12}$ to $R^{14}$ represents a methyl group.

In formula (A2-11), it is particularly desirable that $R^{11}$ represent a methyl group.

The polymer (A2) can be obtained, for example, by a conventional radical polymerization or the like of the monomers corresponding with each of the structural units, using a radical polymerization initiator such as azobisisobutyronitrile (AIBN).

Furthermore, in the polymer (A2), by using a chain transfer agent such as $HS-CH_2-CH_2-CH_2-C(CF_3)_2-OH$, a $-C(CF_3)_2-OH$ group can be introduced at the terminals of the polymer (A2). Such a copolymer having introduced a hydroxyalkyl group in which some of the hydrogen atoms of the alkyl group are substituted with fluorine atoms is effective in decreasing developing defects and LER (line edge roughness: unevenness of the side walls of a line pattern).

The weight average molecular weight (Mw) (the polystyrene equivalent value determined by gel permeation chromatography) of the polymer (A2) is not particularly limited, but is preferably 2,000 to 50,000, more preferably 3,000 to 30,000, and most preferably 5,000 to 20,000. By making the weight average molecular weight no more than the upper limit of the above-mentioned range, the polymer (A2) exhibits satisfactory solubility in a resist solvent when used as a resist. On the other hand, by making the weight average molecular weight at least as large as the lower limit of the above-mentioned range, dry etching resistance and cross-sectional shape of the resist pattern becomes satisfactory.

Further, the dispersity (Mw/Mn) is preferably 1.0 to 5.0, more preferably 1.0 to 3.0, and most preferably 1.2 to 2.5. Here, Mn is the number average molecular weight.

In the component (A), as the polymer (A2), one type of resin may be used alone, or two or more types may be used in combination.

In the component (A), in terms of the effects of the present invention, the weight ratio of the polymer (A1) to the polymer (A2) is preferably within the range from 1:99 to 99:1, more preferably 5:95 to 75:25, still more preferably 10:90 to 75:25, and most preferably 10:90 to 50:50. When the amount of the polymer (A1) is at least as large as the lower limit of the above-mentioned range, the effect of suppressing elution of a substance during immersion exposure becomes excellent. On the other hand, when the amount of the polymer (A1) is no more than the upper limit of the above-mentioned range, the lithography properties are improved.

<Component (B)>

As the component (B), there is no particular limitation, and any of the known acid generators used in conventional chemically amplified resist compositions can be used. Examples of these acid generators are numerous, and include onium salt-based acid generators such as iodonium salts and sulfonium salts; oxime sulfonate-based acid generators; diazomethane-based acid generators such as bisalkyl or bisaryl sulfonyl diazomethanes and poly(bis-sulfonyl)diazomethanes; nitrobenzylsulfonate-based acid generators; iminosulfonate-based acid generators; and disulfone-based acid generators.

Examples of onium salt-based acid generators include compounds represented by general formula (b-0) shown below.

[Chemical Formula 32]

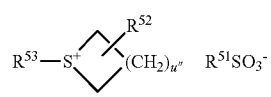 (b-0)

wherein $R^{51}$ represents a linear, branched or cyclic alkyl group, or a linear, branched or cyclic fluorinated alkyl group; $R^{52}$ represents a hydrogen atom, a hydroxyl group, a halogen atom, a linear or branched alkyl group, a linear or branched halogenated alkyl group, or a linear or branched alkoxy group; $R^{53}$ represents an aryl group which may have a substituent; and u" represents an integer of 1 to 3.

In general formula (b-0), $R^{51}$ represents a linear, branched or cyclic alkyl group, or a linear, branched or cyclic fluorinated alkyl group.

The linear or branched alkyl group preferably has 1 to 10 carbon atoms, more preferably 1 to 8 carbon atoms, and most preferably 1 to 4 carbon atoms.

The cyclic alkyl group preferably has 4 to 12 carbon atoms, more preferably 5 to 10 carbon atoms, and most preferably 6 to 10 carbon atoms.

The linear or branched fluorinated alkyl group preferably has 1 to 10 carbon atoms, more preferably 1 to 8 carbon atoms, and most preferably 1 to 4 carbon atoms. The cyclic fluorinated alkyl group preferably has 4 to 12 carbon atoms, more preferably 5 to 10 carbon atoms, and most preferably 6 to 10 carbon atoms. The fluorination ratio of the fluorinated alkyl group (percentage of the number of fluorine atoms substituting the hydrogen atoms within the alkyl group, based on the total number of hydrogen atoms within the alkyl group prior to fluorination) is preferably from 10 to 100%, more preferably from 50 to 100%, and it is particularly desirable that all of the hydrogen atoms are substituted with fluorine atoms, as the acid strength increases.

$R^{51}$ is most preferably a linear alkyl group or fluorinated alkyl group.

$R^{52}$ represents a hydrogen atom, a hydroxyl group, a halogen atom, a linear or branched alkyl group, a linear or branched halogenated alkyl group, or a linear or branched alkoxy group.

Examples of the halogen atom for $R^{52}$ include a fluorine atom, a bromine atom, a chlorine atom and an iodine atom, and a fluorine atom is preferable.

The alkyl group for $R^{52}$ is linear or branched, and preferably has 1 to 5 carbon atoms, more preferably 1 to 4 carbon atoms, and most preferably 1 to 3 carbon atoms.

The halogenated alkyl group for $R^{52}$ is a group in which some or all of the hydrogen atoms of the alkyl group have been substituted with halogen atoms. As the alkyl group of the halogenated alkyl group, the same as the alkyl group for $R^{52}$ may be exemplified. As the halogen atoms for substituting the hydrogen atoms of the alkyl group, the same as the halogen atom for $R^{52}$ may be exemplified. In the halogenated alkyl group, it is preferable that 50 to 100% of the hydrogen atoms of the alkyl group be substituted with halogen atoms, and it is more preferable that all of the hydrogen atoms are substituted with halogen atoms.

The alkoxy group for $R^{52}$ is linear or branched, and preferably has 1 to 5 carbon atoms, more preferably 1 to 4 carbon atoms, and most preferably 1 to 3 carbon atoms.

Among these, as $R^{52}$, a hydrogen atom is particularly desirable.

$R^{53}$ represents an aryl group which may have a substituent, preferably an aryl group of 6 to 20 carbon atoms, and examples of the basic ring excluding the substituent include a naphthyl group, a phenyl group and an anthracenyl group. In terms of the effects of the present invention and absorption of exposure ray such as ArF excimer laser, a phenyl group is preferable.

Examples of the substituent include a hydroxyl group and a lower alkyl group (linear or branched, and preferably has no more than 5 carbon atoms, and a methyl group is particularly desirable).

As the aryl group for $R^{53}$, those which do not have a substituent are preferable.

u" is an integer of 1 to 3, preferably 2 or 3, and it is particularly desirable that u" be 3.

As preferable examples of acid generators represented by general formula (b-0), the following can be exemplified.

[Chemical Formula 33]

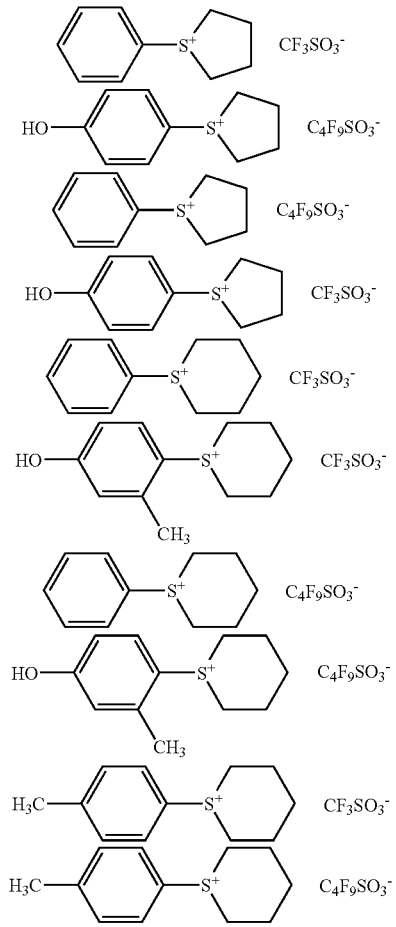

Examples of onium salt-based acid generators other than those represented by general formula (b-0) include compounds represented by general formula (b-1) or (b-2) shown below.

[Chemical Formula 34]

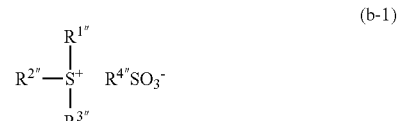

(b-1)

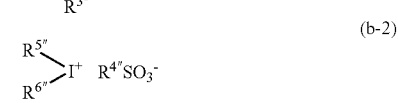

(b-2)

wherein $R^{1''}$ to $R^{3''}$, $R^{5''}$ and $R^{6''}$ each independently represents an aryl group or alkyl group; and $R^{4''}$ represents a linear, branched or cyclic alkyl group or fluorinated alkyl group, with the proviso that at least one of $R^{1''}$ to $R^{3''}$ represents an aryl group, and at least one of $R^{5''}$ and $R^{6''}$ represents an aryl group.

In formula (b-1), $R^{1''}$ to $R^{3''}$ each independently represents an aryl group or an alkyl group. Among $R^{1''}$ to $R^{3''}$, at least one group represents an aryl group. Among $R^{1''}$ to $R^{3''}$, two or more groups are preferably aryl groups, and it is particularly desirable that all of $R^{1''}$ to $R^{3''}$ be aryl groups.

The aryl group for $R^{1''}$ to $R^{3''}$ is not specifically limited. For example, an aryl group having 6 to 20 carbon atoms may be used in which some or all of the hydrogen atoms of the aryl group may or may not be substituted with alkyl groups, alkoxy groups or halogen atoms. The aryl group is preferably an aryl group having 6 to 10 carbon atoms because it can be synthesized at a low cost. Specific examples thereof include a phenyl group and naphthyl group.

The alkyl group, with which hydrogen atoms of the aryl group may be substituted, is preferably an alkyl group having 1 to 5 carbon atoms, and most preferably a methyl group, an ethyl group, a propyl group, an n-butyl group, or a tert-butyl group.

The alkoxy group, with which hydrogen atoms of the aryl group may be substituted, is preferably an alkoxy group having 1 to 5 carbon atoms, and most preferably a methoxy group or an ethoxy group.

The halogen atom, with which hydrogen atoms of the aryl group may be substituted, is preferably a fluorine atom.

The alkyl group for $R^{1''}$ to $R^{3''}$ is not specifically limited and includes, for example, a linear, branched or cyclic alkyl group having 1 to 10 carbon atoms. In terms of achieving excellent resolution, the alkyl group preferably has 1 to 5 carbon atoms. Specific examples thereof include a methyl group, an ethyl group, an n-propyl group, an isopropyl group, an n-butyl group, an isobutyl group, an n-pentyl group, a cyclopentyl group, a hexyl group, a cyclohexyl group, a nonyl group, and a decanyl group, and a methyl group is most preferable because it is excellent in resolution and can be synthesized at a low cost.

It is particularly desirable that each of $R^{1''}$ to $R^{3''}$ be a phenyl group or a naphthyl group.

$R^{4''}$ represents a linear, branched or cyclic alkyl group or fluorinated alkyl group.

The linear or branched alkyl group preferably has 1 to 10 carbon atoms, more preferably 1 to 8 carbon atoms, and most preferably 1 to 4 carbon atoms.

The cyclic alkyl group is preferably a cyclic group, as described for $R^{1''}$, having 4 to 15 carbon atoms, more preferably 4 to 10 carbon atoms, and most preferably 6 to 10 carbon atoms.

The fluorinated alkyl group preferably has 1 to 10 carbon atoms, more preferably 1 to 8 carbon atoms, and most preferably 1 to 4 carbon atoms.

Further, the fluorination ratio of the fluorinated alkyl group (ratio of fluorine atoms within the alkyl group) is preferably from 10 to 100%, more preferably from 50 to 100%, and it is particularly desirable that all hydrogen atoms are substituted with fluorine atoms because the acid strength increases.

$R^{4''}$ is most preferably a linear or cyclic alkyl group or fluorinated alkyl group.

In formula (b-2), $R^{5''}$ and $R^{6''}$ each independently represents an aryl group or alkyl group. At least one of $R^{5''}$ and $R^{6''}$ represents an aryl group. It is most preferable that both of $R^{5''}$ and $R^{6''}$ represent an aryl group.

As the aryl group for $R^{5''}$ and $R^{6''}$, the same as the aryl groups for $R^{1''}$ to $R^{3''}$ can be exemplified.

As the alkyl group for $R^{5''}$ and $R^{6''}$, the same as the alkyl groups for $R^{1''}$ to $R^{3''}$ can be exemplified.

It is particularly desirable that both of $R^{5''}$ and $R^{6''}$ represent a phenyl group. As $R^{4''}$ in formula (b-2), the same as those mentioned above for $R^{4''}$ in formula (b-1) can be exemplified.

Specific examples of suitable onium salt-based acid generators represented by formula (b-1) or (b-2) include diphenyliodonium trifluoromethanesulfonate or nonafluorobutanesulfonate, bis(4-tert-butylphenyl)iodonium trifluoromethanesulfonate or nonafluorobutanesulfonate, triphenylsulfonium trifluoromethanesulfonate, heptafluoropropanesulfonate or nonafluorobutanesulfonate, tri(4-methylphenyl)sulfonium trifluoromethanesulfonate, heptafluoropropanesulfonate or nonafluorobutanesulfonate, dimethyl(4-hydroxynaphthyl)sulfonium trifluoromethanesulfonate, heptafluoropropanesulfonate or nonafluorobutanesulfonate, monophenyldimethylsulfonium trifluoromethanesulfonate, heptafluoropropanesulfonate or nonafluorobutanesulfonate, diphenylmonomethylsulfonium trifluoromethanesulfonate, heptafluoropropanesulfonate or nonafluorobutanesulfonate, (4-methylphenyl)diphenylsulfonium trifluoromethanesulfonate, heptafluoropropanesulfonate or nonafluorobutanesulfonate, (4-methoxyphenyl)diphenylsulfonium trifluoromethanesulfonate, heptafluoropropanesulfonate or nonafluorobutanesulfonate, tri(4-tert-butyl)phenylsulfonium trifluoromethanesulfonate, heptafluoropropanesulfonate or nonafluorobutanesulfonate, diphenyl(1-(4-methoxy)naphthyl)sulfonium trifluoromethanesulfonate, heptafluoropropanesulfonate or nonafluorobutanesulfonate; and di(1-naphthyl)phenylsulfonium trifluoromethanesulfonate, heptafluoropropanesulfonate or nonafluorobutanesulfonate. It is also possible to use onium salts in which the anion moiety of these onium salts are replaced by methanesulfonate, n-propanesulfonate, n-butanesulfonate, or n-octanesulfonate.

Further, acid generators in which the anion moiety in general formula (b-1) or (b-2) is replaced with an anion moiety represented by general formula (b-3) or (b-4) shown below (the cation moiety is the same as (b-1) or (b-2)) may be used.

[Chemical Formula 35]

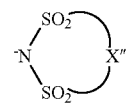

(b-3)

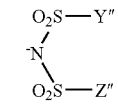

(b-4)

wherein X" represents an alkylene group of 2 to 6 carbon atoms in which at least one hydrogen atom has been substituted with a fluorine atom; and Y" and Z" each independently represents an alkyl group of 1 to 10 carbon atoms in which at least one hydrogen atom has been substituted with a fluorine atom.

X" represents a linear or branched alkylene group in which at least one hydrogen atom has been substituted with a fluorine atom, and the alkylene group has 2 to 6 carbon atoms, preferably 3 to 5 carbon atoms, and most preferably 3 carbon atoms.

Y" and Z" each independently represents a linear or branched alkyl group in which at least one hydrogen atom has been substituted with a fluorine atom, and the alkyl group has 1 to 10 carbon atoms, preferably 1 to 7 carbon atoms, and more preferably 1 to 3 carbon atoms.

The smaller the number of carbon atoms of the alkylene group of X" or those of the alkyl group of Y" and Z" within the range of the number of carbon atoms, the better the solubility in a resist solvent.

Further, in the alkylene group of X" or the alkyl group of Y" and Z", it is preferable that the number of hydrogen atoms substituted with fluorine atoms is as large as possible, as the acid strength increases, and the transparency to high energy radiation of 200 nm or less or electron beam is improved. The fluorination ratio of the alkylene group or alkyl group is preferably from 70 to 100%, more preferably from 90 to 100%, and it is particularly desirable that the alkylene group or alkyl group be a perfluoroalkylene group or perfluoroalkyl group in which all hydrogen atoms are substituted with fluorine atoms.

In the present description, an oximesulfonate-based acid generator is a compound having at least one group represented by general formula (B-1) shown below, and has a feature of generating acid by irradiation. Such oximesulfonate-based acid generators are widely used for a chemically amplified resist composition, and can be appropriately selected.

[Chemical Formula 36]

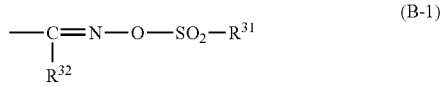
(B-1)

wherein $R^{31}$ and $R^{32}$ each independently represents an organic group.

The organic group for $R^{31}$ and $R^{32}$ refers to a group containing a carbon atom, and may include atoms other than carbon atoms (e.g., a hydrogen atom, an oxygen atom, a nitrogen atom, a sulfur atom, a halogen atom (such as a fluorine atom and a chlorine atom) and the like).

As the organic group for $R^{31}$, a linear, branched, or cyclic alkyl group or aryl group is preferable. The alkyl group or the aryl group may have a substituent. The substituent is not particularly limited, and examples thereof include a fluorine atom and a linear, branched, or cyclic alkyl group having 1 to 6 carbon atoms. The expression "having a substituent" means that some or all of the hydrogen atoms of the alkyl group or the aryl group are replaced with substituents.

The alkyl group preferably has 1 to 20 carbon atoms, more preferably 1 to 10 carbon atoms, still more preferably 1 to 8 carbon atoms, still more preferably 1 to 6 carbon atoms, and most preferably 1 to 4 carbon atoms. As the alkyl group, partially or completely halogenated alkyl group (hereinafter, sometimes referred to as a "halogenated alkyl group") is particularly desirable. The "partially halogenated alkyl group" refers to an alkyl group in which some of the hydrogen atoms are substituted with halogen atoms, and the "completely halogenated alkyl group" refers to an alkyl group in which all of the hydrogen atoms are substituted with halogen atoms. Examples of the halogen atom include a fluorine atom, a chlorine atom, a bromine atom and an iodine atom, and a fluorine atom is particularly desirable. In other words, the halogenated alkyl group is preferably a fluorinated alkyl group.

The aryl group preferably has 4 to 20 carbon atoms, more preferably 4 to 10 carbon atoms, and most preferably 6 to 10 carbon atoms. As the aryl group, partially or completely halogenated aryl group is particularly desirable. The "partially halogenated aryl group" refers to an aryl group in which some of the hydrogen atoms are substituted with halogen atoms, and the "completely halogenated aryl group" refers to an aryl group in which all of hydrogen atoms are substituted with halogen atoms.

As $R^{31}$, an alkyl group of 1 to 4 carbon atoms which has no substituent or a fluorinated alkyl group of 1 to 4 carbon atoms is particularly desirable.

As the organic group for $R^{32}$, a linear, branched, or cyclic alkyl group, aryl group, or cyano group is preferable. Examples of the alkyl group and the aryl group for $R^{32}$ are the same as those of the alkyl group and the aryl group for $R^{31}$.

As $R^{32}$, a cyano group, an alkyl group of 1 to 8 carbon atoms having no substituent or a fluorinated alkyl group of 1 to 8 carbon atoms is particularly desirable.

Preferred examples of the oxime sulfonate-based acid generator include compounds represented by general formula (B-2) or (B-3) shown below.

[Chemical Formula 37]

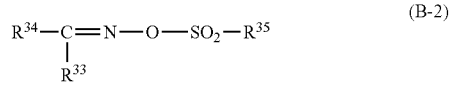
(B-2)

wherein $R^{33}$ represents a cyano group, an alkyl group having no substituent or a halogenated alkyl group; $R^{34}$ represents an aryl group; and $R^{35}$ represents an alkyl group having no substituent or a halogenated alkyl group.

[Chemical Formula 38]

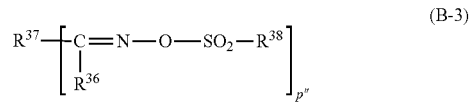
(B-3)

wherein $R^{36}$ represents a cyano group, an alkyl group having no substituent or a halogenated alkyl group; $R^{37}$ represents a divalent or trivalent aromatic hydrocarbon group; $R^{38}$ represents an alkyl group having no substituent or a halogenated alkyl group; and p" represents 2 or 3.

In general formula (B-2), the alkyl group having no substituent or the halogenated alkyl group for $R^{33}$ preferably has 1 to 10 carbon atoms, more preferably 1 to 8 carbon atoms, and most preferably 1 to 6 carbon atoms.

As for the $R^{33}$, a halogenated alkyl group is preferable, and a fluorinated alkyl group is more preferable.

The fluorinated alkyl group for $R^{33}$ preferably has 50% or more of the hydrogen atoms of the alkyl group fluorinated, more preferably 70% or more, and still more preferably 90% or more.

Examples of the aryl group for $R^{34}$ include groups in which one hydrogen atom has been removed from an aromatic hydrocarbon ring, such as a phenyl group, a biphenyl group, a fluorenyl group, a naphthyl group, an anthracyl group, and a phenantryl group, and heteroaryl groups in which some of the carbon atoms constituting the ring(s) of these groups are substituted with hetero atoms such as an oxygen atom, a sulfur atom, and a nitrogen atom. Of these, a fluorenyl group is preferable.

The aryl group for $R^{34}$ may have a substituent such as an alkyl group of 1 to 10 carbon atoms, a halogenated alkyl group, or an alkoxy group. The alkyl group and halogenated alkyl group as the substituent preferably has 1 to 8 carbon atoms, and more preferably 1 to 4 carbon atoms. The halogenated alkyl group is preferably a fluorinated alkyl group.

The alkyl group having no substituent or the halogenated alkyl group for $R^{35}$ preferably has 1 to 10 carbon atoms, more preferably 1 to 8 carbon atoms, and most preferably 1 to 6 carbon atoms.

As $R^{35}$, a halogenated alkyl group is preferable, and a partially or completely fluorinated alkyl group is most preferable.

In terms of enhancing the strength of the acid generated, the fluorinated alkyl group for $R^{35}$ preferably has 50% or more of the hydrogen atoms of the alkyl group fluorinated, more preferably 70% or more, still more preferably 90% or more. A completely fluorinated alkyl group in which 100% of the hydrogen atoms are substituted with fluorine atoms is particularly desirable.

In general formula (B-3), the alkyl group having no substituent and the halogenated alkyl group for $R^{36}$ are the same as the alkyl group having no substituent and the halogenated alkyl group for $R^{33}$.

Examples of the divalent or trivalent aromatic hydrocarbon group for $R^{37}$ include groups in which one or two hydrogen atoms have been removed from the aryl group for $R^{34}$.

As the alkyl group having no substituent or the halogenated alkyl group for $R^{38}$, the same one as the alkyl group having no substituent or the halogenated alkyl group for $R^{35}$ can be used.

p" is preferably 2.

Specific examples of suitable oxime sulfonate-based acid generators include α-(p-toluenesulfonyloxyimino)-benzyl cyanide, α-(p-chlorobenzenesulfonyloxyimino)-benzyl cyanide, α-(4-nitrobenzenesulfonyloxyimino)-benzyl cyanide, α-(4-nitro-2-trifluoromethylbenzenesulfonyloxyimino)-benzyl cyanide, α-(benzenesulfonyloxyimino)-4-chlorobenzyl cyanide, α-(benzenesulfonyloxyimino)-2,4-dichlorobenzyl cyanide, α-(benzenesulfonyloxyimino)-2,6-dichlorobenzyl cyanide, α-(benzenesulfonyloxyimino)-4-methoxybenzyl cyanide, α-(2-chlorobenzenesulfonyloxyimino)-4-methoxybenzyl cyanide, α-(benzenesulfonyloxyimino)-thien-2-yl acetonitrile, α-(4-dodecylbenzenesulfonyloxyimino)benzyl cyanide, α-[(p-toluenesulfonyloxyimino)-4-methoxyphenyl]acetonitrile, α-[(dodecylbenzenesulfonyloxyimino)-4-methoxyphenyl]acetonitrile, α-(tosyloxyimino)-4-thienyl cyanide, α-(methylsulfonyloxyimino)-1-cyclopentenyl acetonitrile, α-(methylsulfonyloxyimino)-1-cyclohexenyl acetonitrile, α-(methylsulfonyloxyimino)-1-cycloheptenyl acetonitrile, α-(methylsulfonyloxyimino)-1-cyclooctenyl acetonitrile, α-(trifluoromethylsulfonyloxyimino)-1-cyclopentenyl acetonitrile, α-(trifluoromethylsulfonyloxyimino)-cyclohexyl acetonitrile, α-(ethylsulfonyloxyimino)-ethyl acetonitrile, α-(propylsulfonyloxyimino)-propyl acetonitrile, α-(cyclohexylsulfonyloxyimino)-cyclopentyl acetonitrile, α-(cyclohexylsulfonyloxyimino)-cyclohexyl acetonitrile, α-(cyclohexylsulfonyloxyimino)-1-cyclopentenyl acetonitrile, α-(ethylsulfonyloxyimino)-1-cyclopentenyl acetonitrile, α-(isopropylsulfonyloxyimino)-1-cyclopentenyl acetonitrile, α-(n-butylsulfonyloxyimino)-1-cyclopentenyl acetonitrile, α-(ethylsulfonyloxyimino)-1-cyclohexenyl acetonitrile, α-(isopropylsulfonyloxyimino)-1-cyclohexenyl acetonitrile, α-(n-butylsulfonyloxyimino)-1-cyclohexenyl acetonitrile, α-(methylsulfonyloxyimino)-phenyl acetonitrile, α-(methylsulfonyloxyimino)-p-methoxyphenyl acetonitrile, α-(trifluoromethylsulfonyloxyimino)-phenyl acetonitrile, α-(trifluoromethylsulfonyloxyimino)-p-methoxyphenyl acetonitrile, α-(ethylsulfonyloxyimino)-p-methoxyphenyl acetonitrile, α-(propylsulfonyloxyimino)-p-methylphenyl acetonitrile, and α-(methylsulfonyloxyimino)-p-bromophenyl acetonitrile.

Further, oxime sulfonate-based acid generators disclosed in Japanese Unexamined Patent Application, First Publication No. Hei 9-208554 (Chemical Formulas 18 and 19 shown in paragraphs [0012] to [0014]) and oxime sulfonate-based acid generators disclosed in WO 2004/074242A2 (Examples 1 to 40 described at pages 65 to 85) may be preferably used.

Furthermore, as preferable examples, the following can be exemplified.

[Chemical Formula 39]

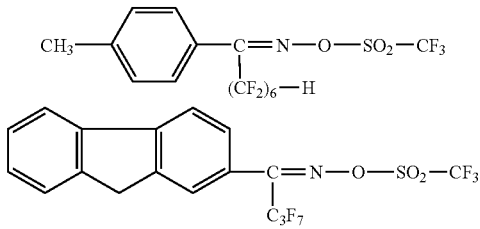

-continued

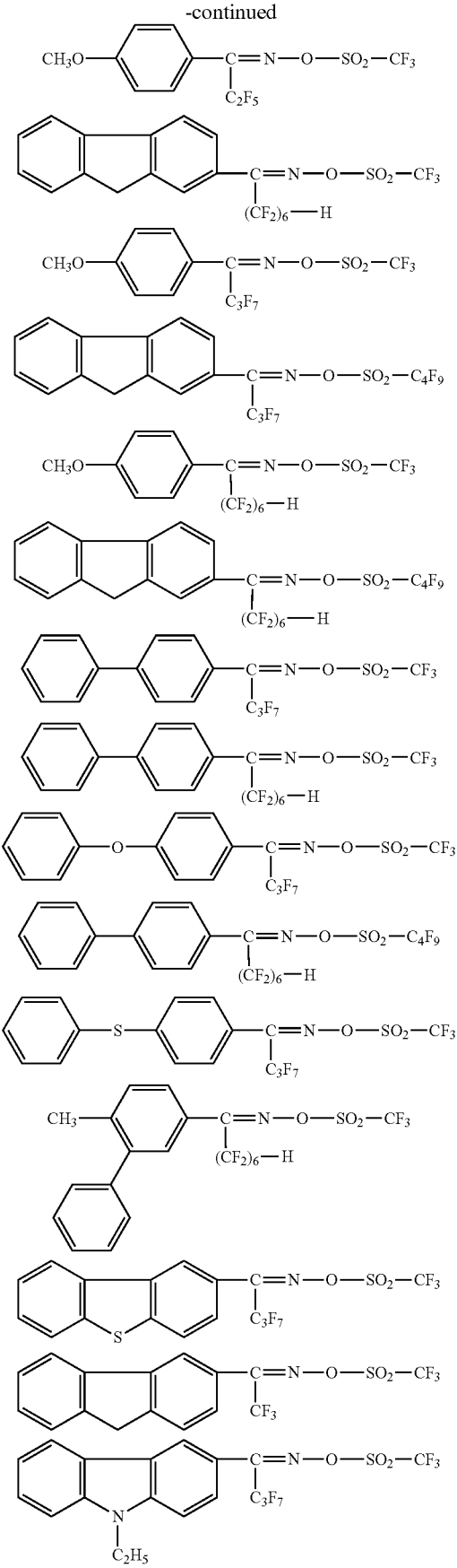

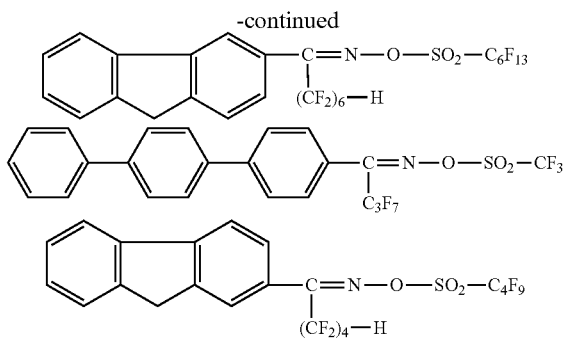

Among the above-exemplified compounds, the following 4 compounds are preferable.

[Chemical Formula 40]

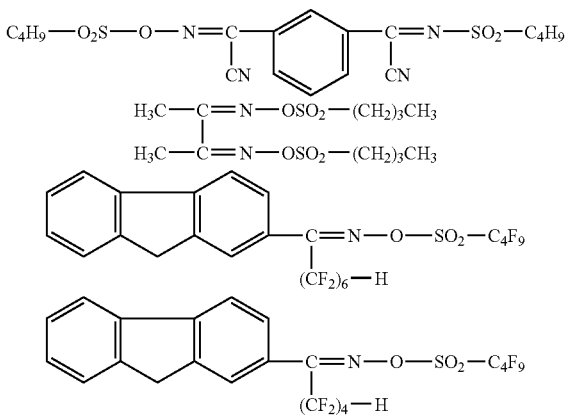

Of the aforementioned diazomethane-based acid generators, specific examples of suitable bisalkyl or bisaryl sulfonyl diazomethanes include bis(isopropylsulfonyl)diazomethane, bis(p-toluenesulfonyl)diazomethane, bis(1,1-dimethylethylsulfonyl)diazomethane, bis(cyclohexylsulfonyl)diazomethane, and bis(2,4-dimethylphenylsulfonyl)diazomethane.

Further, diazomethane-based acid generators disclosed in Japanese Unexamined Patent Application, First Publication No. Hei 11-035551, Japanese Unexamined Patent Application, First Publication No. Hei 11-035552 and Japanese Unexamined Patent Application, First Publication No. Hei 11-035573 may be preferably used.

Furthermore, as poly(bis-sulfonyl)diazomethanes, those disclosed in Japanese Unexamined Patent Application, First Publication No. Hei 11-322707, including 1,3-bis(phenylsulfonyldiazomethylsulfonyl)propane, 1,4-bis(phenylsulfonyldiazomethylsulfonyl)butane, 1,6-bis(phenylsulfonyldiazomethylsulfonyl)hexane, 1,10-bis(phenylsulfonyldiazomethylsulfonyOdecane, 1,2-bis(cyclohexylsulfonyldiazomethylsulfonyl)ethane, 1,3-bis(cyclohexylsulfonyldiazomethylsulfonyl)propane, 1,6-bis(cyclohexylsulfonyldiazomethylsulfonyl)hexane, and 1,10-bis(cyclohexylsulfonyldiazomethylsulfonyl)decane, may be exemplified.

As the component (B), one type of acid generator may be used, or two or more types may be used in combination.

In the present invention, as the component (B), it is preferable to use an onium salt having a fluorinated alkylsulfonic acid ion as the anion moiety.

The amount of the component (B) within the positive resist composition for immersion exposure according to the present invention is typically 0.5 to 30 parts by weight, and preferably 1 to 10 parts by weight, relative to 100 parts by weight of the component (A). When the amount of the component (B) is within the above-mentioned range, formation of a resist pattern can be satisfactorily performed. Further, by virtue of the above-mentioned range, a uniform solution can be obtained and the storage stability becomes satisfactory.

<Optional Components>

In the positive resist composition for immersion exposure according to the present invention, for improving the resist pattern shape and the post exposure stability of the latent image formed by the pattern-wise exposure of the resist layer, a nitrogen-containing organic compound (D) (hereafter referred to as the component (D)) may be added as an optional component.

A multitude of these components (D) have already been proposed, and any of these known compounds may be used, although a cyclic amine, an aliphatic amine, and particularly a secondary aliphatic amine or tertiary aliphatic amine is preferable.

Examples of these aliphatic amines include amines in which at least one hydrogen atom of ammonia ($NH_3$) has been substituted with an alkyl group or hydroxyalkyl group of no more than 12 carbon atoms (i.e., alkylamines or alkylalcoholamines). Specific examples of these aliphatic amines include monoalkylamines such as n-hexylamine, n-heptylamine, n-octylamine, n-nonylamine, and n-decylamine; dialkylamines such as diethylamine, di-n-propylamine, di-n-heptylamine, di-n-octylamine, and dicyclohexylamine; trialkylamines such as trimethylamine, triethylamine, tri-n-propylamine, tri-n-butylamine, tri-n-hexylamine, tri-n-pentylamine, tri-n-heptylamine, tri-n-octylamine, tri-n-nonylamine, tri-n-decanylamine, and tri-n-dodecylamine; and alkylalcoholamines such as diethanolamine, triethanolamine, diisopropanolamine, triisopropanolamine, di-n-octanolamine, and tri-n-octanolamine.

Among these, alkylalcoholamines and trialkylamines are preferable, and alkylalcoholamines are particularly desirable. Among alkylalcoholamines, triethanolamine and triisopropanolamine are preferable.

Examples of the cyclic amine include a heterocyclic compound containing a nitrogen atom as a hetero atom. The heterocyclic compound may be a monocyclic compound (aliphatic monocyclic amine), or a polycyclic compound (aliphatic polycyclic amine).

Specific examples of the aliphatic monocyclic amine include piperidine and piperazine.

The aliphatic polycyclic amine preferably has 6 to 10 carbon atoms, and specific examples thereof include 1,5-diazabicyclo[4.3.0]-5-nonene, 1,8-diazabicyclo[5.4.0]-7-undecene, hexamethylenetetramine, and 1,4-diazabicyclo[2.2.2]octane.

These compounds can be used either alone, or in combinations of two or more different compounds.

The component (D) is typically used in an amount within a range from 0.01 to 5.0 parts by weight, relative to 100 parts by weight of the component (A).

Furthermore, in the positive resist composition for immersion exposure according to the present invention, for preventing any deterioration in sensitivity, and improving the resist pattern shape and the post exposure stability of the latent image formed by the pattern-wise exposure of the resist layer, an organic carboxylic acid, or a phosphorus oxo acid or derivative thereof (E) (hereafter referred to as the component (E)) can also be added as another optional component.

Examples of suitable organic carboxylic acids include malonic acid, citric acid, malic acid, succinic acid, benzoic acid, and salicylic acid.

Examples of suitable phosphorus oxo acids or derivatives thereof include phosphoric acid or derivatives thereof such as esters, including phosphoric acid, di-n-butyl phosphate and diphenyl phosphate; phosphonic acid or derivatives thereof such as esters, including phosphonic acid, dimethyl phosphonate, di-n-butyl phosphonate, phenylphosphonic acid, diphenyl phosphonate, and dibenzyl phosphonate; and phosphinic acid or derivatives thereof such as esters, including phosphinic acid and phenylphosphinic acid.

The component (E) is typically used in an amount within a range from 0.01 to 5.0 parts by weight, relative to 100 parts by weight of the component (A).

If desired, other miscible additives can also be added to the positive resist composition for immersion exposure according to the present invention. Examples of such miscible additives include additive resins for improving the performance of the resist film, surfactants for improving the applicability, dissolution inhibitors, plasticizers, stabilizers, colorants, halation prevention agents, and dyes.

The resist composition for immersion exposure according to the present invention can be prepared by dissolving the materials for the resist composition in an organic solvent (hereafter, frequently referred to as "component (S)").

The component (S) may be any organic solvent which can dissolve the respective components to give a uniform solution, and any one or more kinds of organic solvents can be appropriately selected from those which have been conventionally known as solvents for a chemically amplified resist.

Examples thereof include lactones such as γ-butyrolactone; ketones such as acetone, methyl ethyl ketone, cyclohexanone, methyl-n-amyl ketone methyl isoamyl ketone, and 2-heptanone; polyhydric alcohols and derivatives thereof, such as ethylene glycol, diethylene glycol, propylene glycol and dipropylene glycol; polyhydric alcohol derivatives including compounds having an ether bond, such as a monoalkylether (e.g., monomethylether, monoethylether, monopropylether or monobutylether) or monophenylether of any of these polyhydric alcohols or compounds having an ester bond; cyclic ethers such as dioxane; esters such as methyl lactate, ethyl lactate (EL), methyl acetate, ethyl acetate, butyl acetate, methyl pyruvate, ethyl pyruvate, methyl methoxypropionate, and ethyl ethoxypropionate; and aromatic organic solvents such as anisole, ethylbenzylether, cresylmethylether, diphenylether, dibeazylether, phenetole, butylphenylether, ethylbenzene, diethylbenzene, amylbenzene, isopropylbenzene, toluene, xylene, cymene and mesitylene.

These solvents can be used individually, or in combination as a mixed solvent.

Among these, propylene glycol monomethyl ether acetate (PGMEA), propylene glycol monomethyl ether (PGME) and EL are preferable.

Further, among the mixed solvents, a mixed solvent obtained by mixing PGMEA with a polar solvent is preferable. The mixing ratio (weight ratio) of the mixed solvent can be appropriately determined, taking into consideration the compatibility of the PGMEA with the polar solvent, but is preferably from 1:9 to 9:1, more preferably from 2:8 to 8:2.

More specifically, when EL is mixed as the polar solvent, the PGMEA:EL weight ratio is preferably from 1:9 to 9:1, and more preferably from 2:8 to 8:2. Alternatively, when PGME is mixed as the polar solvent, the PGMEA:PGME is preferably from 1:9 to 9:1, more preferably from 2:8 to 8:2, and still more preferably 3:7 to 7:3.

Further, as the component (S), a mixed solvent of at least one of PGMEA and EL with γ-butyrolactone is also preferable. The mixing ratio (former:latter) of such a mixed solvent is preferably from 70:30 to 95:5.

The amount of the component (S) is not particularly limited, and is appropriately adjusted to a concentration which enables coating of a coating solution to a substrate, depending on the thickness of the coating film. In general, the component (S) is used in an amount such that the solid content of the resist composition becomes within the range from 2 to 20% by weight, and preferably from 5 to 15% by weight.

Dissolving of the materials for a resist composition in the component (S) can be conducted by simply mixing and stirring each of the above components together using conventional methods, and where required, the composition may also be mixed and dispersed using a dispersion device such as a dissolver, a homogenizer, or a triple roll mill. Furthermore, following mixing, the composition may also be filtered using a mesh or a membrane filter or the like.

By the positive resist composition for immersion exposure according to the present invention, elution of a substance during immersion exposure can be suppressed, and excellent lithography properties can be obtained.

The reason why elution of a substance during immersion exposure can be suppressed has not been elucidated yet, but one of the main reasons is presumed that by virtue of the component (A) including the polymer (A1) and the polymer (A2), the receding angle of the obtained resist film becomes large and the sliding angle becomes small, as compared to the case where the polymer (A2) is used alone. More specifically, the reason is presumed as follows. With respect to a resist film formed by using the positive resist composition for immersion exposure according to the present invention, the dynamic contact angle (the contact angle at which a water droplet starts to slide when the resist film is inclined, including the contact angle at the front-end point of the water droplet in the sliding direction (advancing angle) and the contact angle at the rear-end point of the water droplet in the sliding direction (receding angle)) and sliding angle (the inclination angle of the resin film at which a water droplet starts to slide when the resist film is inclined) change, which are different from a resist composition in which only the polymer (A2) is used as the component (A). Specifically, the receding angle becomes large, whereas the receding angle becomes small. As described above, in an immersion exposure, the resist film comes into contact with an immersion medium such as water. Therefore, it is presumed that the elution of a substance from the resist is affected by the properties of the resist film surface (e.g., hydrophilicity and hydrophobicity). In the present invention, it is presumed that by virtue of using a specific component (A), the above-mentioned properties are changed. As a result, a resist film in which the elution of a substance from the resist film to the immersion medium is suppressed and which exhibits excellent lithography properties can be obtained.

As shown in FIG. 1, when a droplet 1 is placed on a plane 2 and the plane 2 is gradually inclined, the receding angle is the angle $\theta_1$ formed between the upper end 1a of the droplet 1 and the plane 2 as the droplet 1 starts to move (slide) on the plane 2, and the sliding angle is the inclination angle $\theta_2$ of the plane 2 as measured when the droplet 1 starts to move (slide) on the plane 2.

In the present description, the receding angle and sliding angle are measured in the following manner.

First, a resist composition solution is spin-coated onto a silicone substrate having a diameter of 6 inches, and then heated at a temperature of 90° C. for 90 seconds to form a resist film.

Subsequently, with respect to the formed resist film, the receding angle and sliding angle can be measured by using commercially available measurement apparatuses such as AUTO SLIDING ANGLE: SA-30 DM (manufactured by Kyowa Interface Science Co. Ltd.), and AUTO DISPENSER: AD-31 (manufactured by Kyowa Interface Science Co. Ltd.).

With respect to the positive resist composition for immersion exposure according to the present invention, it is preferable that a resist film formed by using the positive resist composition have a receding angle of 45 degrees or more, more preferably 50 to 150 degrees, still more preferably 55 to 130 degrees, and most preferably 60 to 100 degrees. When the receding angle is 45 degrees or more, the effect of suppressing the elution of a substance during the immersion exposure is enhanced. The reason for this has not been elucidated yet, but it is presumed that one of the main reasons is related to the hydrophobicity of the resist film. More specifically, it is presumed that since an aqueous substance such as water is used as the immersion medium, higher hydrophobicity has an influence on the swift removal of the immersion medium from the surface of the resist film after the immersion exposure. On the other hand, when the receding angle is no more than 150 degrees, the lithography properties become excellent.

Further, with respect to the positive resist composition for immersion exposure according to the present invention, it is preferable that a resist film formed by using the positive resist composition have a sliding angle of no more than 36 degrees, more preferably 10 to 36 degrees, still more preferably 12 to 30 degrees, and most preferably 15 to 25 degrees. When the sliding angle is no more than 36 degrees, the effect of suppressing elution of a substance during immersion exposure is improved. On the other hand, when the sliding angle is 10 degrees or more, the lithography properties become excellent.

The level of the receding angle and sliding angle can be adjusted by the formulation of the resist composition for immersion exposure, for example, by changing the mixing ratio of the polymer (A1) to the polymer (A2) within the component (A), and the amount of the structural unit (a'3). More specifically, for example, by making the amount of the polymer (A1) within the component (A) 1% by weight or more, the receding angle becomes significantly large, and the sliding angle becomes significantly small, as compared to the case where the polymer (A2) is used alone.

As described above, the positive resist composition for immersion exposure according to the present invention is advantageous in that elution of a substance during immersion exposure is suppressed.

Therefore, in immersion exposure, deformation of the resist film and change in refractive index of the immersion medium can be suppressed. As the change in refractive index of the immersion medium is suppressed, undulation and LER (line edge roughness) of the resist pattern formed can be reduced, and lithography properties such as the pattern shape become excellent.

Further, the level of contamination of the lens within the exposure apparatus can be lowered. Therefore, there is no need for protection against these disadvantages, and hence, the present invention can contribute to simplifying the process and the exposure apparatus.

Even when only the polymer (A1) is used as the resin component (A), elution of a substance can be suppressed. However, as a result of the studies of the present inventors, it was found that, when only the polymer (A1) is used as the resin component (A), lithography properties (e.g., shape of the pattern) are markedly lowered.

In addition to the effect of suppressing elution of a substance, the positive resist composition for immersion exposure according to the present invention exhibits excellent lithography properties. Therefore, when the positive resist composition of the present invention is used as a resist for immersion exposure, a resist pattern can be formed without any practical problems.

Further, by the positive resist composition according to the present invention, a resist pattern with high resolution, for example, a resist pattern with a dimension of 120 nm or less can be formed.

Furthermore, the process margin becomes large. For example, the fluctuation in the size of the resist pattern caused by the change in the bake temperature is small, and the bake-temperature margin is large. Moreover, the mask linearity (mask reproducibility) is excellent. For example, resist patterns faithful to masks of various dimensions and pitches can be formed with the same exposure dose.

The reasons why the lithography properties are excellent has not been elucidated yet, but are presumed as follows. By virtue of the elution of a substance being suppressed, deterioration of the resist and change in the refractive index of the immersion medium can be suppressed. Further, the polymer (A2) used in the present invention has an acetal-type acid dissociable, dissolution inhibiting group. Such an acid dissociable, dissolution inhibiting group can be dissociated with a low activation energy, as compared to, for example, a tertiary alkyl ester-type acid dissociable, dissolution inhibiting group. Therefore, the acid dissociable, dissolution inhibiting groups can be readily dissociated at exposed portions, and as a result, the difference (contrast) in the alkali solubility between exposed portions and unexposed portions becomes large. Furthermore, the degree of dissociation is hardly affected by the exposure dose and the bake temperature.

<<Method of Forming a Resist Pattern>>

Next, the method of forming a resist pattern according to the present invention will be described.

The method of forming a resist pattern according to the present invention includes applying a positive resist composition for immersion exposure according to the present invention to a substrate to form a resist film on the substrate; subjecting the resist film to immersion exposure; and developing the resist film to form a resist pattern.

A preferable example of the method of forming a resist pattern according to the present invention will be described.

First, a positive resist composition for immersion exposure according to the present invention is applied to the surface of a substrate such as a silicon wafer using a spinner or the like, and a prebake (post applied bake (PAB) treatment) is performed, to thereby form a resist film.

An organic or inorganic anti-reflection film may be optionally provided between the substrate and the applied layer of the resist composition to form a double-layer laminate.

Alternatively, a double-layer laminate in which an organic anti-reflective film is provided on top of the resist film can be formed, or a triple-layer laminate further including an additional bottom layer anti-reflection film can be fowled.

The anti-reflection film provided on top of the resist film is preferably soluble in an alkali developing solution.

The steps up until this point can be conducted by using conventional techniques. The operating conditions and the like are appropriately selected depending on the formulation and the characteristics of the positive resist composition for immersion exposure being used.

Subsequently, the obtained resist film is subjected to selective immersion exposure (liquid immersion lithography) through a desired mask pattern. At this time, the region between the resist film and the lens at the lowermost point of the exposure apparatus is pre-filled with a solvent (immersion medium) that has a larger refractive index than the refractive index of air, and the exposure (immersion exposure) is conducted in this state.

There are no particular limitations on the wavelength used for the exposure, and an ArF excimer laser, KrF excimer laser or $F_2$ laser or the like can be used. The resist composition according to the present invention is effective for KrF or ArF excimer lasers, and is particularly effective for ArF excimer lasers.

As described above, in a formation method of the present invention, during exposure, the region between the resist film and the lens at the lowermost point of the exposure apparatus is filled with an immersion medium, and exposure (immersion exposure) is conducted in this state.

The immersion medium preferably exhibits a refractive index larger than the refractive index of air, and about the same as the refractive index of the resist film formed from the positive resist composition for immersion exposure according to the present invention. The refractive index of the immersion medium is not particularly limited as long at it satisfies the above-mentioned requirements.

Examples of this immersion medium which exhibits a refractive index that is larger than the refractive index of air but smaller than the refractive index of the resist composition being used include water, fluorine-based inert liquids, and silicon-based solvents.

Specific examples of the fluorine-based inert liquids include liquids containing a fluorine-based compound such as $C_3HCl_2F_5$, $C_4F_9OCH_3$, $C_4F_9OC_2H_5$ or $C_5H_3F_7$ as the main component, which have a boiling point within a range from 70 to 180° C. and preferably from 80 to 160° C. A fluorine-based inert liquid having a boiling point within the above-mentioned range is advantageous in that the removal of the immersion medium after the exposure can be conducted by a simple method.

As a fluorine-based inert liquid, a perfluoroalkyl compound in which all of the hydrogen atoms of the alkyl group are substituted with fluorine atoms is particularly desirable. Examples of these perfluoroalkyl compounds include perfluoroalkylether compounds and perfluoroalkylamine compounds.

Specifically, one example of a suitable perfluoroalkylether compound is perfluoro(2-butyl-tetrahydrofuran) (boiling point 102° C.), and an example of a suitable perfluoroalkylamine compound is perfluorotributylamine (boiling point 174° C.).

A positive resist composition for immersion exposure according to the present invention is particularly resistant to any adverse effects caused by water, and because the resulting sensitivity and shape of the resist pattern profile are excellent, water is preferably used as the immersion medium which exhibits a refractive index that is larger than the refractive index of air. Furthermore, water is also preferred in terms of cost, safety, environmental friendliness, and versatility.

Subsequently, following completion of the immersion exposure step, post exposure baking (PEB) is conducted, and then a developing treatment is performed using an alkali developing liquid formed from an aqueous alkali solution. Thereafter, water rinse is preferably conducted with pure water. This water rinse is conducted by dripping or spraying water onto the surface of the substrate while rotating the substrate, and washes away the developing solution and those portions of the positive resist composition for immersion exposure that have been dissolved by the developing solution. By conducting a subsequent drying treatment, a resist pattern is obtained in which the resist film (coating of the positive resist composition for immersion exposure) has been patterned into a shape corresponding to the mask pattern.

EXAMPLES

As follows is a description of examples of the present invention, although the scope of the present invention is by no way limited by these examples.

The polymers used in the Examples and Comparative Examples are shown below.

[Chemical Formula 41]

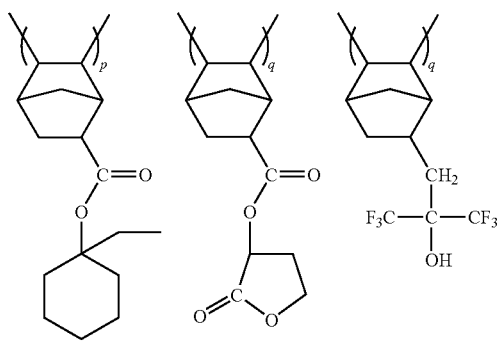

Polymer 1

(Mw: 5,650, Mw/Mn: 1.6, p:q:r=2:2:6 (molar ratio), manufactured by Promerus LLC)

[Chemical Formula 42]

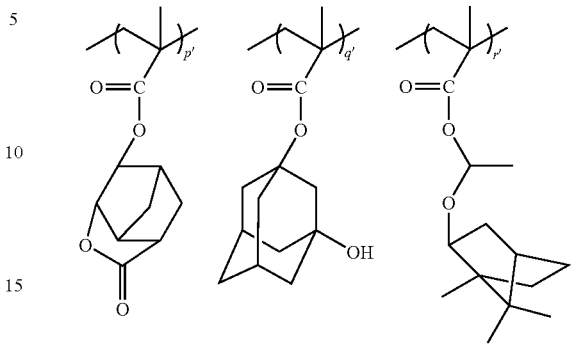

Polymer 2

(Mw: 8,600, Mw/Mn: 1.9, p':q':r'=4:2:4 (molar ratio), a resin synthesized by the method described in Japanese Unexamined Patent Application, First Publication No. 2005-220059)

Examples 1 to 4 and Comparative Examples 1 and 2

The components shown in Table 1 were mixed together and dissolved to obtain positive resist composition solutions.

TABLE 1

| | Component (A) | | Component (B) | Component (D) | Component (S) |
|---|---|---|---|---|---|
| | (A1) | (A2) | | | |
| Comp. Ex. 1 | — | Polymer 2 [100] | (B)-1 [3.0] | (D)-1 [0.2] | (S)-1 [1150] |
| Ex. 1 | Polymer 1 [5] | Polymer 2 [95] | (B)-1 [3.0] | (D)-1 [0.2] | (S)-1 [1150] |
| Ex. 2 | Polymer 1 [10] | Polymer 2 [90] | (B)-1 [3.0] | (D)-1 [0.2] | (S)-1 [1150] |
| Ex. 3 | Polymer 1 [25] | Polymer 2 [75] | (B)-1 [3.0] | (D)-1 [0.2] | (S)-1 [1150] |
| Ex. 4 | Polymer 1 [50] | Polymer 2 [50] | (B)-1 [3.0] | (D)-1 [0.2] | (S)-1 [1150] |
| Comp. Ex. 2 | Polymer 1 [100] | — | (B)-1 [3.0] | (D)-1 [0.2] | (S)-1 [1150] |

In Table 1, the reference characters indicate the following. Further, the values in brackets [ ] indicate the amount (in terms of parts by weight) of the component added.

(B)-1: triphenylsulfonium nonafluorobutanesulfonate
(D)-1: triethanolamine
(S)-1: a mixed solvent of PGMEA/EL=8/2 (weight ratio)

Using the obtained positive resist composition solutions, evaluations were performed as follows.

<Measurement of Receding Angle and Sliding Angle>

Each of the obtained positive resist composition solutions was applied onto an 8-inch silicon wafer using a spinner, and was prebaked on a hot plate at 110° C. for 90 seconds to thereby form a resist film having a thickness of 200 nm. Then, one droplet (50 μl) of pure water was dropped onto the resist film, and the receding angle and the sliding angle (receding angle and sliding angle prior to exposure) were measured using the apparatus under conditions as described below.

(Name of Apparatus)
AUTO SLIDING ANGLE: SA-30 DM (manufactured by Kyowa Interface Science Co. Ltd.)
AUTO DISPENSER: AD-31 (manufactured by Kyowa Interface Science Co. Ltd.)
(Analysis software (attached to the apparatus))
FAMAS Further, a resist film was formed in the same manner as described above, and the receding angle and the sliding angle (receding angle and sliding angle after exposure) were measured in substantially the same manner as described above, except that an open frame exposure (exposure without a mask) was performed using a simple exposure apparatus VUVES4500 (manufactured by Lintec Japan Corporation) with an ArF excimer laser (193 nm).

Figure 2:
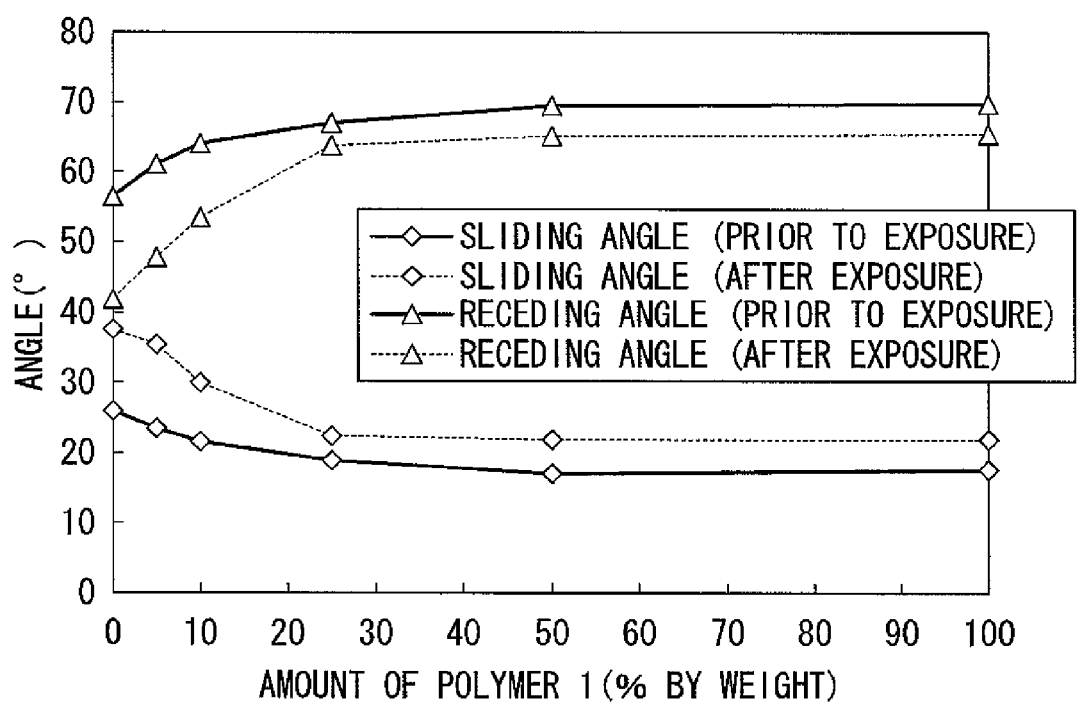
FIG. 2 is a graph showing the results of the measurement of the receding angle and the sliding angle.

The measurement results of the receding angles and sliding angles of the resist film prior to and after exposure are shown in Table 2. Further, from the results, a graph was drawn, taking the amount of the polymer 1 (% by weight) on the horizontal axis, and the receding angle and the sliding angle (°) on the vertical axis. The graph is shown in FIG. 2.

As seen from the results, in Examples 1 to 4 in which the polymer 1 corresponding to the polymer (A1) was used in combination with the polymer 2 corresponding to the polymer (A2), both of the sliding angles prior to and after exposure were small and both of the receding angles prior to and after exposure were large, as compared to Comparative Example 1 in which the polymer 2 was used alone. Further, the difference between the sliding angles prior to and after exposure and the difference between the receding angle prior to and after exposure were small, as compared to Comparative Example 1.

TABLE 2

|  | Sliding angle (°) | | Receding angle (°) | |
| --- | --- | --- | --- | --- |
|  | Prior to exposure | After exposure | Prior to exposure | After exposure |
| Comp. Ex. 1 | 26.0 | 37.5 | 56.5 | 41.9 |
| Ex. 1 | 23.5 | 35.5 | 61.2 | 47.8 |
| Ex. 2 | 21.5 | 30.0 | 64.0 | 53.5 |
| Ex. 3 | 19.0 | 22.5 | 66.9 | 63.9 |
| Ex. 4 | 17.0 | 22.0 | 69.4 | 65.1 |
| Comp. Ex. 2 | 17.5 | 22.0 | 69.6 | 65.4 |

<Evaluation of Eluted Substance>

Using the positive resist composition solutions, resist films were formed in the same manner as described above. Then, using VRC310S (manufactured by S.E.S CO., LTD.), one droplet of pure water (150 µl) was moved from the center of the wafer in a circular manner at room temperature at a constant linear velocity (area: 221.56 cm$^2$). Thereafter, the droplet was collected, and analyzed by an analyzing apparatus Agilent-HP1100 LC-MSD (manufactured by Agilent Technologies), and the amount of elution (mol/cm$^2$) of the cation moiety (PAG+) and anion moiety (PAG−) of the component (B) was determined.

Further, resist films were formed in the same manner as described above. Then, using a simple exposure apparatus VUVES4500 (manufactured by Lintec Japan Corporation), an open frame exposure (exposure without a mask) was performed with an ArF excimer laser (193 nm).

Subsequently, the exposed resist film was analyzed in the same manner as described above, and the amount of elution (mol/cm$^2$) of the cation moiety (PAG+) and anion moiety (PAG−) of the component (B) was determined.

The results are shown in Table 3. In Table 3, the concentration (amount) below the detection limit is indicated as "ND".

TABLE 3

| | Amount of elution ($\times 10^{-12}$ mol/cm$^2$) | | | |
| --- | --- | --- | --- | --- |
| | Prior to exposure | | After exposure | |
| | PAG+ | PAG− | PAG+ | PAG− |
| Comp. Ex. 1 | 4.34 | 7.23 | 0.04 | 26.83 |
| Ex. 1 | 3.78 | 6.60 | 0.18 | 20.83 |
| Ex. 2 | 3.35 | 6.21 | ND | 21.29 |
| Ex. 3 | 2.46 | 5.57 | ND | 14.71 |
| Ex. 4 | 1.40 | 5.02 | ND | 10.82 |
| Comp. Ex. 2 | 0.13 | 4.23 | ND | 10.22 |

As seen from the results shown above, when the positive resist compositions of

Examples 1 to 4 using a combination of the polymer 1 and the polymer 2 were used, elution of the component (B) into the immersion medium (water), especially elution of PAG−, was suppressed prior to and after exposure, as compared to the positive resist composition of Comparative Example 1 using only the polymer 2, and hence, the effect of suppressing elution was confirmed.

In the above-described evaluations, the "amount of elution prior to exposure" is for evaluating the amount of elution at unexposed portions of the resist film during the formation of a resist pattern by selective exposure. Further, the "amount of elution after exposure" is for evaluating the amount of elution at the exposed portions. Therefore, since the amount of a substance eluted into the immersion medium (water) was small both prior to and after exposure, it was confirmed that the positive resist compositions of Examples 1 to 4 can be preferably used in a method of forming a resist pattern including an immersion exposure step.

Further, from the results of the measurements of the receding angles, sliding angles and amounts of elution, it is apparent that increase in the receding angle and decrease in the sliding angle correlates with the effect of suppressing elution of a substance. Furthermore, it is presumed that the effect of suppressing elution of a substance has an influence on reducing the difference between the sliding angles prior to and after exposure the difference between the receding angles prior to and after exposure.

<Lithography Properties>

Using the positive resist composition solutions obtained in Examples 1 to 3 and Comparative Example 2, the lithography properties were evaluated.

An organic anti-reflection film composition (product name: ARC-29A, manufactured by Brewer Science Ltd.) was applied onto the surface of an 8-inch silicon wafer using a spinner, and the composition was then baked at 205° C. for 60 seconds, thereby forming an organic anti-reflection film having a thickness of 77 nm. The positive resist composition solution obtained above was applied onto the surface of the anti-reflection film using a spinner, and was then prebaked (PAB) on a hotplate at a PAB temperature indicated in Table 4 for 60 seconds and dried, thereby forming a resist film having a film thickness of 150 nm.

Subsequently, the resist film was selectively irradiated with an ArF excimer laser (193 nm) through a mask pattern, using an ArF exposure apparatus NSR-S302 (manufactured by Nikon Corporation, NA (numerical aperture)=0.60, 2/3 annular illumination). Thereafter, a post exposure bake (PEB) treatment was conducted at a PEB temperature indicated in Table 4 for 60 seconds, followed by development at 23° C. in a 2.38% by weight aqueous solution of tetramethylammonium hydroxide for 30 seconds. Then, the resist was rinsed for 30 seconds with pure water, followed by drying by shaking, thereby forming an isolated space pattern (hereafter, referred to as "Iso pattern") of 120 nm.

The thus obtained Iso pattern was observed using a scanning electron microscope (SEM). The results are shown in Table 4.

TABLE 4

|  | PAB (° C.) | PEB(° C.) | Resolution (nm) | Shape |
|---|---|---|---|---|
| Ex. 1 | 120 | 110 | 120 | ○ |
| Ex. 2 | 120 | 110 | 120 | ○ |
| Ex. 3 | 120 | 110 | 120 | ○ |
| Comp. Ex. 2 | 100 | 100 | 120 | X |

○: Rectangular shape
X: T-top shape

As shown by the results, by using a positive resist composition of the present invention in which a combination of the polymer (A1) and the polymer (A2) is used as the component (A), a resist pattern with high resolution could be formed. Further, it was confirmed that the shape of the resist pattern was excellent.

On the other hand, with respect to the positive resist composition of Comparative Example 2 in which the polymer (A1) was used alone as the component (A), the resist film formed therefrom had a T-top shape, and the resist pattern was extremely poor.

From the results above, it is apparent that the positive resist composition of the present invention using a combination of the polymer (A1) and the polymer (A2) is capable of suppressing elution of a substance during immersion exposure, exhibits excellent lithography properties, and hence, the positive resist composition of the present invention can be preferably used for immersion exposure.

INDUSTRIAL APPLICABILITY

The positive resist composition for immersion exposure according to the present invention is capable of suppressing elution of a substance during immersion exposure and exhibits excellent lithography properties. Therefore, the positive resist composition of the present invention is extremely useful in forming a resist film for immersion exposure.

The invention claimed is:

1. A positive resist composition for immersion exposure comprising a resin component (A) which has acid dissociable, dissolution inhibiting groups and exhibits increased alkali solubility under action of acid and an acid-generator component (B) which generates acid upon exposure,
said resin component (A) comprising a cyclic principal chain polymer (A1) and a non-cyclic principal chain polymer (A2) having a structural unit (a) derived from acrylic acid as a principal chain, and
said non-cyclic principal chain polymer (A2) having a structural unit (a1) derived from an acrylate ester having an acid dissociable, dissolution inhibiting group (p1) represented by general formula (p1) shown below:

[Chemical Formula 1]

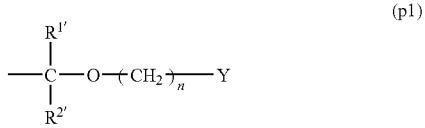

wherein $R^1$, and $R^2$, each independently represents a hydrogen atom or an alkyl group of 1 to 5 carbon atoms; n represents an integer of 0 to 3; and Y represents an alkyl group of 1 to 5 carbon atoms or an aliphatic cyclic group.

2. The positive resist composition for immersion exposure according to claim 1, wherein said cyclic principal chain polymer (A1) is a polymer having a structural unit derived from a polycycloolefin as a principal chain.

3. The positive resist composition for immersion exposure according to claim 2, wherein said cyclic principal chain polymer (A1) has a structural unit (a'1) represented by general formula (a'1) shown below:

[Chemical Formula 2]

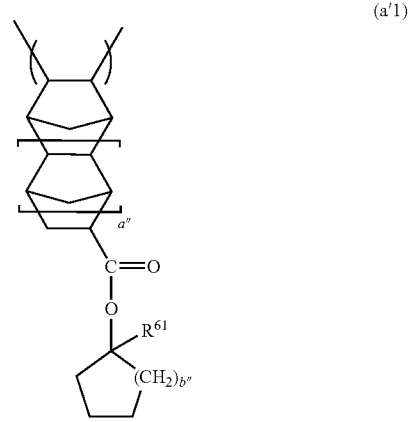

wherein $R^{61}$ represents an alkyl group of 1 to 5 carbon atoms; a" represents 0 or 1; and b" represents an integer of 1 to 3.

4. The positive resist composition for immersion exposure according to claim 3, wherein said cyclic principal chain polymer (A1) further has a structural unit (a'2) represented by general formula (a'2) shown below:

[Chemical Formula 3]

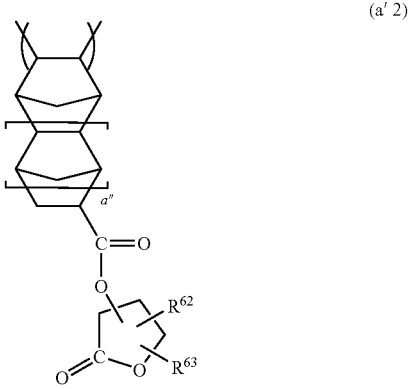

wherein $R^{62}$ and $R^{63}$ each independently represents a hydrogen atom or an alkyl group of 1 to 5 carbon atoms; and a" represents 0 or 1.

5. The positive resist composition for immersion exposure according to claim 3, wherein said cyclic principal chain polymer (A1) further has a structural unit (a'3) represented by general formula (a'3) shown below:

[Chemical Formula 4]

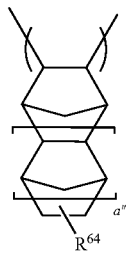

(a'3)

wherein $R^{64}$ represents an organic group containing an alkali-soluble group; and a" represents 0 or 1.

6. The positive resist composition for immersion exposure according to claim 5, wherein $R^{64}$ in general formula (a'3) is a group represented by general formula (a'31) shown below:

[Chemical Formula 5]

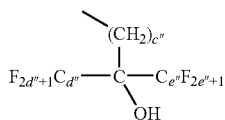

(a'31)

wherein c" represents an integer of 1 to 5; and d" and e" each independently represents an integer of 1 to 5.

7. The positive resist composition for immersion exposure according to claim 3, wherein said cyclic principal chain polymer (A1) further has a structural unit (a'2) represented by general formula (a'2) shown below and a structural unit (a'3) represented by general formula (a'3) shown below:

[Chemical Formula 6]

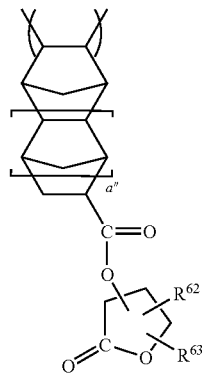

(a'2)

wherein $R^{62}$ and $R^{63}$ each independently represents a hydrogen atom or an alkyl group of 1 to 5 carbon atoms; and a" represents 0 or 1; and

[Chemical Formula 7]

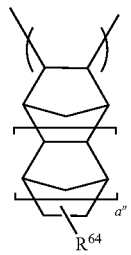

(a'3)

wherein $R^{64}$ represents an organic group containing an alkali-soluble group; and a" represents 0 or 1.

8. The positive resist composition for immersion exposure according to claim 1, wherein said non-cyclic principal chain polymer (A2) further has a structural unit (a2) derived from an acrylate ester having a lactone-containing cyclic group.

9. The positive resist composition for immersion exposure according to claim 1, wherein said non-cyclic principal chain polymer (A2) further has a structural unit (a3) derived from an acrylate ester having a polar group-containing aliphatic hydrocarbon group.

10. The positive resist composition for immersion exposure according to claim 1, wherein said non-cyclic principal chain polymer (A2) further has a structural unit (a2) derived from an acrylate ester having a lactone-containing cyclic group and a structural unit (a3) derived from an acrylate ester having a polar group-containing aliphatic hydrocarbon group.

11. The positive resist composition for immersion exposure according to claim 1, wherein the weight ratio of said cyclic principal chain polymer (A1) to said non-cyclic principal chain polymer (A2) is in the range of 99:1 to 1:99.

12. The positive resist composition for immersion exposure according to claim 1, which further comprises a nitrogen-containing organic compound (D).

13. A method of forming a resist pattern, comprising: applying a positive resist composition for immersion exposure of any one of claims 1 to 12 to a substrate to form a resist film on the substrate; subjecting said resist film to immersion exposure; and developing said resist film to form a resist pattern.

* * * * *